US012604740B2

(12) United States Patent
Shi et al.

(10) Patent No.: US 12,604,740 B2
(45) Date of Patent: Apr. 14, 2026

(54) CHIP PACKAGE WITH INTEGRATED EMBEDDED OFF-DIE INDUCTORS

(71) Applicant: XILINX, INC., San Jose, CA (US)

(72) Inventors: Hong Shi, Los Gatos, CA (US);
Li-Sheng Weng, San Diego, CA (US);
Frank Peter Lambrecht, San Jose, CA
(US); Jing Jing, San Jose, CA (US);
Shuxian Wu, San Jose, CA (US)

(73) Assignee: XILINX, INC., San Jose, CA (US)

( * ) Notice: Subject to any disclaimer, the term of this
patent is extended or adjusted under 35
U.S.C. 154(b) by 690 days.

(21) Appl. No.: 17/896,972

(22) Filed: Aug. 26, 2022

(65) Prior Publication Data

US 2024/0071958 A1      Feb. 29, 2024

(51) Int. Cl.
*H01L 23/64* (2006.01)
*H01L 23/00* (2006.01)
*H01L 23/498* (2006.01)
(52) U.S. Cl.
CPC ...... *H01L 23/645* (2013.01); *H01L 23/49816*
(2013.01); *H01L 23/49833* (2013.01); *H01L
24/16* (2013.01); *H01L 24/24* (2013.01);
*H01L 24/73* (2013.01); *H01L 2224/16227*
(2013.01); *H01L 2224/24225* (2013.01); *H01L
2224/73209* (2013.01); *H01L 2924/1427*
(2013.01); *H01L 2924/30107* (2013.01)
(58) Field of Classification Search
CPC ......... H01L 2924/30107; H01L 23/645; H01L
2924/19011; H01L 2924/19042; H01L
2224/2101; H01L 2224/2401; H01L
2224/214; H01L 24/20; H01L
2224/73209; H01L 2223/6655; H01L 2224/16227; H01L 23/3128; H01L
23/49816; H01L 24/16; H01L 24/24;
H01L 23/49822; H01L 23/49833
USPC ........................................................ 257/531
See application file for complete search history.

(56) References Cited

U.S. PATENT DOCUMENTS

| | | | |
|---|---|---|---|
| 8,143,987 B2 | 3/2012 | Kireev | |
| 8,592,943 B2 | 11/2013 | Wu et al. | |
| 8,823,133 B2 | 9/2014 | Jenkins et al. | |
| 8,860,180 B2 | 10/2014 | Jing et al. | |
| 9,330,823 B1 | 5/2016 | Rahman et al. | |
| 9,365,387 B2 | 6/2016 | Beers et al. | |
| 9,406,738 B2 | 8/2016 | Kireev et al. | |
| 10,085,342 B2 | 9/2018 | Cheah et al. | |
| 10,163,557 B2 | 12/2018 | Lambert et al. | |
| 11,043,470 B2 | 6/2021 | Jing et al. | |

(Continued)

OTHER PUBLICATIONS

U.S. Appl. No. 19/065,838, filed Feb. 27, 2025 Entitled "Structure
and Method for Embedding a Plurality of Devices and Components
Into a Thick Substrate Core".

(Continued)

*Primary Examiner* — Didarul A Mazumder
(74) *Attorney, Agent, or Firm* — Patterson + Sheridan,
LLP

(57) ABSTRACT

A chip package and method for fabricating the same are
provided that includes embedded off-die inductors coupled
in series. One of the off-die inductors is disposed in a
redistribution layer formed on a bottom surface of an
integrated circuit (IC) die. The other of the series connected
off-die inductors is disposed in a substrate of the chip
package. The substrate may be either an interposer or a
package substrate.

19 Claims, 13 Drawing Sheets

(56)        References Cited

U.S. PATENT DOCUMENTS

| | | | |
|---|---|---|---|
| 2012/0147578 A1* | 6/2012 | Jin | H01L 23/645 |
| | | | 361/811 |
| 2012/0217547 A1 | 8/2012 | Ando et al. | |
| 2017/0040266 A1* | 2/2017 | Lin | H01L 23/5389 |
| 2019/0252351 A1* | 8/2019 | Lin | H01L 23/66 |
| 2020/0020652 A1* | 1/2020 | Hill | H01L 23/49822 |
| 2022/0068870 A1* | 3/2022 | Pak | H01L 23/49838 |
| 2022/0262778 A1* | 8/2022 | Yu | H01L 21/76898 |
| 2023/0387044 A1* | 11/2023 | Maruthamuthu | H04B 1/0078 |
| 2024/0178087 A1 | 5/2024 | Weng et al. | |
| 2024/0234304 A1 | 7/2024 | Kulkarni et al. | |
| 2025/0079328 A1 | 3/2025 | Kulkarni et al. | |
| 2025/0096089 A1 | 3/2025 | Spurney et al. | |

OTHER PUBLICATIONS

U.S. Appl. No. 18/619,090, filed Mar. 27, 2024 Entitled "Integrated Circuit Package Device With a Power Delivery Substrate".
U.S. Appl. No. 17/860,223, filed Feb. 24, 2022.

* cited by examiner

Figure 19:
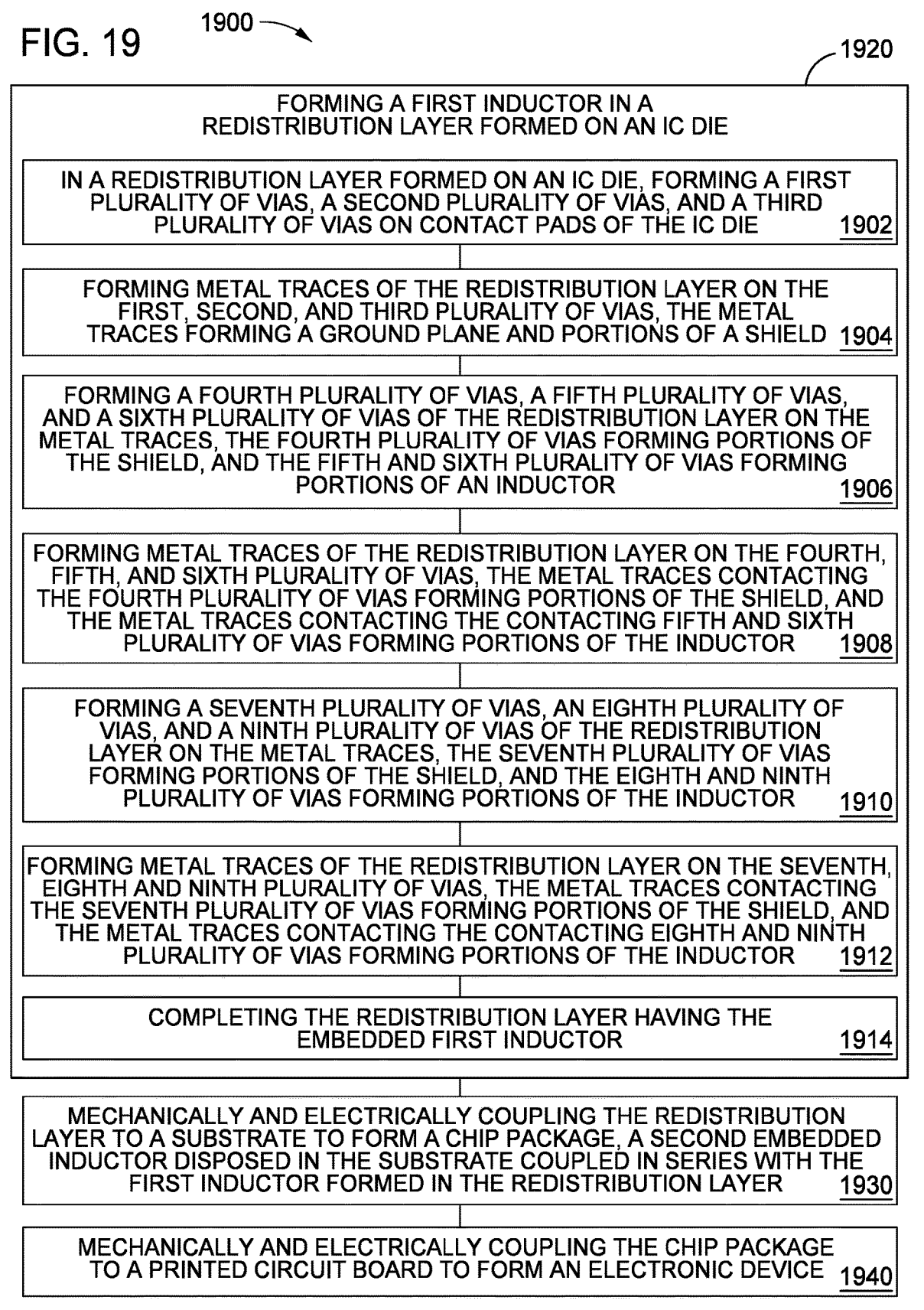

FORMING A FIRST INDUCTOR IN A
REDISTRIBUTION LAYER FORMED ON AN IC DIE

IN A REDISTRIBUTION LAYER FORMED ON AN IC DIE, FORMING A FIRST
PLURALITY OF VIAS, A SECOND PLURALITY OF VIAS, AND A THIRD
PLURALITY OF VIAS ON CONTACT PADS OF THE IC DIE          1902

FORMING METAL TRACES OF THE REDISTRIBUTION LAYER ON THE
FIRST, SECOND, AND THIRD PLURALITY OF VIAS, THE METAL
TRACES FORMING A GROUND PLANE AND PORTIONS OF A SHIELD  1904

FORMING A FOURTH PLURALITY OF VIAS, A FIFTH PLURALITY OF VIAS,
AND A SIXTH PLURALITY OF VIAS OF THE REDISTRIBUTION LAYER ON THE
METAL TRACES, THE FOURTH PLURALITY OF VIAS FORMING PORTIONS OF
THE SHIELD, AND THE FIFTH AND SIXTH PLURALITY OF VIAS FORMING
PORTIONS OF AN INDUCTOR          1906

FORMING METAL TRACES OF THE REDISTRIBUTION LAYER ON THE FOURTH,
FIFTH, AND SIXTH PLURALITY OF VIAS, THE METAL TRACES CONTACTING
THE FOURTH PLURALITY OF VIAS FORMING PORTIONS OF THE SHIELD, AND
THE METAL TRACES CONTACTING THE CONTACTING FIFTH AND SIXTH
PLURALITY OF VIAS FORMING PORTIONS OF THE INDUCTOR          1908

FORMING A SEVENTH PLURALITY OF VIAS, AN EIGHTH PLURALITY OF
VIAS, AND A NINTH PLURALITY OF VIAS OF THE REDISTRIBUTION
LAYER ON THE METAL TRACES, THE SEVENTH PLURALITY OF VIAS
FORMING PORTIONS OF THE SHIELD, AND THE EIGHTH AND NINTH
PLURALITY OF VIAS FORMING PORTIONS OF THE INDUCTOR          1910

FORMING METAL TRACES OF THE REDISTRIBUTION LAYER ON THE SEVENTH,
EIGHTH AND NINTH PLURALITY OF VIAS, THE METAL TRACES CONTACTING
THE SEVENTH PLURALITY OF VIAS FORMING PORTIONS OF THE SHIELD, AND
THE METAL TRACES CONTACTING THE CONTACTING EIGHTH AND NINTH
PLURALITY OF VIAS FORMING PORTIONS OF THE INDUCTOR          1912

COMPLETING THE REDISTRIBUTION LAYER HAVING THE
EMBEDDED FIRST INDUCTOR          1914

MECHANICALLY AND ELECTRICALLY COUPLING THE REDISTRIBUTION
LAYER TO A SUBSTRATE TO FORM A CHIP PACKAGE, A SECOND EMBEDDED
INDUCTOR DISPOSED IN THE SUBSTRATE COUPLED IN SERIES WITH THE
FIRST INDUCTOR FORMED IN THE REDISTRIBUTION LAYER          1930

MECHANICALLY AND ELECTRICALLY COUPLING THE CHIP PACKAGE
TO A PRINTED CIRCUIT BOARD TO FORM AN ELECTRONIC DEVICE  1940

CHIP PACKAGE WITH INTEGRATED EMBEDDED OFF-DIE INDUCTORS

TECHNICAL FIELD

Embodiments of the present invention generally relate to a chip package having embedded off-die inductors, and in particular, to a chip package having series coupled inductors, one inductor embedded in a redistribution layer adjacent an integrated circuit die of the chip package and a second inductor embedded in a substrate of the chip package, such as a package substrate or an interposer.

BACKGROUND

Electronic devices, such as tablets, computers, copiers, digital cameras, smart phones, control systems, automated teller machines, data centers, artificial intelligence system, and machine learning systems among others, often employ electronic components which leverage chip package assemblies for increased functionality and higher component density. Conventional chip packaging schemes often utilize a package substrate, often in conjunction with a through-silicon-via (TSV) interposer substrate, to enable a plurality of integrated circuit (IC) dies to be mounted to a single package substrate. The IC dies are mounted to a top side (i.e., top surface) of the package substrate while a bottom side (i.e., bottom surface) of the package substrate is mounted to a printed circuit board (PCB). The IC dies may include memory, logic or other IC devices.

Inductors and transformer are often used in chip packages that include radio frequency (RF) integrated circuit (IC) designs, including LC VCO circuits, Accurate and predictable inductor characteristics with high quality factors are desirable for successful RF IC design, especially for LC VCO circuits, in order to meet product performance and frequency targets. As technology continues to evolve, the number of devices dramatically increases within a given area of an IC. This increased density in an IC die can cause increased parasitic effects on devices or circuits.

As dimensions shrink and power demands increase, the area available for inductors continues to diminish. Conventional surface mounted inductors help mitigate space requirements, but addition routing distances between the IC die and the surface mounted inductor diminishes performance and increases assembly time, and are more susceptible to parasitic losses created by close proximity of the surrounding circuits and power grids to the complicated routings needed to reach the surface mounted inductor from the IC die.

Therefore, a need exists for a chip package with an improved inductor design.

SUMMARY

A chip package and method for fabricating the same are provided that includes embedded off-die inductors coupled in series. One of the off-die inductors is disposed in a redistribution layer formed on a bottom surface of an integrated circuit (IC) die. The other of the series connected off-die inductors is disposed in a substrate of the chip package. The substrate may be either an interposer or a package substrate.

In one example, a chip package is provided that includes an integrated circuit (IC) die having functional circuitry, a substrate, a redistribution layer (RDL), a first inductor and a second inductor. The RDL is disposed between the IC die and a top side of the substrate. The RDL includes at least a first conductive layer and a second conductive layer that are patterned to form RDL circuitry within the RDL. The RDL circuitry connects the IC die to the substrate. The first inductor is formed from portions of the first conductive layer and the second conductive layer of the RDL. The second inductor is disposed in the substrate and coupled in series to the first inductor In another example, the series coupled inductors are coupled to voltage regulator switching circuitry.

In another example, a chip package is provided that includes an integrated circuit (IC) die having functional circuitry, a package substrate, a redistribution layer (RDL), a first inductor, a second inductor, a third inductor and a fourth inductor. The RDL is disposed between the IC die and the top side of the package substrate. The RDL includes at least a first conductive layer and a second conductive layer that are patterned to form RDL circuitry within the RDL. The RDL circuitry connecting the IC die to the package substrate. The first inductor is formed from portions of the first conductive layer and the second conductive layer of the RDL. The second inductor is formed in a core of the package substrate and is coupled in series to the first inductor. The third inductor is formed from portions of the first conductive layer and the second conductive layer of the RDL. The fourth inductor is formed in the core of the package substrate and is coupled in series to the third inductor. The second and fourth inductors are air core inductors. The fourth inductor is disposed adjacent the second inductor. The fourth and second inductors has coils wound in opposite directions.

In another example, inductances of the second and fourth inductors each are at least one order of magnitude greater than inductances of the first and third inductors.

In another example, a first signal path defined through the first and second series connected inductors is configured to transmit signals having a different voltage domain or different voltage phase than a second signal path defined through the third and fourth series connected inductors.

In yet another example, a method for fabricating a chip package is provide. The method includes forming a first inductor within a redistribution layer (RDL) formed on an integrated circuit (IC) die; and connecting the first inductor in series with a second inductor formed a substrate to form a chip package.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 19 is a flow diagram of a method for fabricating a chip package having series connected off-die inductor embedded within a redistribution layer (RDL) and a sub-strate.

To facilitate understanding, identical reference numerals have been used, where possible, to designate identical elements that are common to the figures. It is contemplated that elements of one embodiment may be beneficially incor-porated in other embodiments.

DETAILED DESCRIPTION

A chip package and method for fabricating the same are provided that includes embedded off-die inductors coupled in series. Off-die, as used herein, means ex-situ an integrated circuit (IC) die of the chip package. Stated differently, off-die means not within the body of the IC die. Embedded, as used herein, means not surface mounted, but rather within a structure. The off-die inductors are disposed in structures residing between a bottom of the IC die and a bottom of substrate of the chip package that is configured to mount to a printed circuit board (PCB) via solder ball or a socket. At least two of the series connected, embedded, off-die induc-tors are disposed in different structures. For example, a first inductor of the embedded off-die inductors may be formed in a redistribution layer disposed adjacent the IC die, while a second inductor of the embedded off-die inductors may be formed in a substrate of the chip package. The substrate may be a package substrate or an interposer. As the off-die inductors are not part of the IC die itself, metal layers of the IC die that conventionally would have been dedicated for forming the inductor are now free for other use or additional structures within the IC die. For example, use of off-die inductors opens up extra room for power routing, achieves larger inductances within a small footprint, achieves high Q-value for high performance designs, frees up more thick metal layers on the top die for fabric power delivery network (PDN) to reduce ohmic loss.

The series connected embedded off-die inductors also provide increased inductance without extensively utilizing valuable substrate core space, as only one of the series connected inductors is disposed in a substrate core. The increased inductance allows for greater power efficiency, and is particularly beneficial in stacked architectures that place high power demands on core vias, which further limits the space available for core-based inductors.

Figure 1:
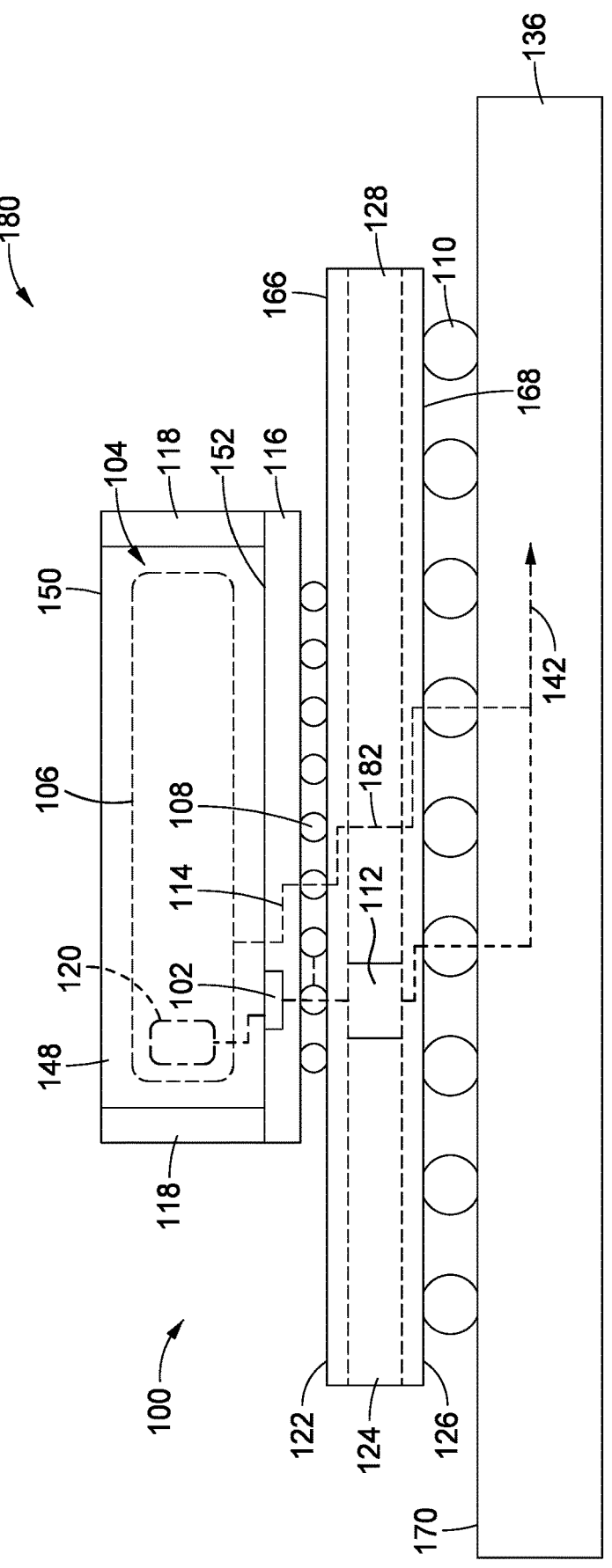
FIG. 1 is a schematic sectional view of one example of chip package having an off-die inductor disposed in a redistribution layer (RDL) disposed between an integrated circuit (IC) die and a package substrate of the chip package.

Turning now to FIG. 1, a schematic sectional view of a chip package 100 is illustrated having to embedded, off-die inductors 102, 112. The chip package 100 includes at least one integrated circuit (IC) die 104, a redistribution layer (RDL) 116 and at least one substrate. The substrate may be a package substrate 128 as illustrated in FIG. 1, or an interposer 190 mounted to a package substrate 128 as illustrated in and later discussed with reference to FIG. 1A. Continuing to refer to FIG. 1, the RDL 116 is formed on the lower surface of the IC die 104. The opposite side of the RDL 116 is coupled to the package substrate 128. The package substrate 128 of the chip package 100 may be mounted on a printed circuit board (PCB) 136 to form an electronic device 180.

At least one embedded off-die inductor (e.g., first induc-tor) 102 is formed in the RDL 116 adjacent the IC die 104. Although in FIG. 1 only a single first inductor 102 is shown, as many embedded off-die inductors may be utilized as desired and as space permits. In one example, the first inductor 102 is sandwiched between the IC die 104 and the package substrate 128.

The first inductor 102 is coupled in series with the second inductor 112 to functional circuitry 106 of the IC die 104, rather than being formed within the IC die 104 or located on the package substrate 128 or other location within the chip package 100 as a surface mounted inductor. Thus, the first inductor 102 is disposed very close to the IC die 104 and thus requires simple and short routings with the RDL 116, which enables excellent performance. Additionally, as the first inductor 102 is not formed within the IC die 104, space normally occupied by on-die inductors is now free within the IC die 104 for additional IC device, improved power routing, and the like. Moreover, the first inductor 102, being coupled in series with the second inductor 112, increases the capacitance of the routing signal path through the inductors 102, 112 with diminished impact on the available space within the chip package 100, and particularly, with dimin-ished impact on the space available within the package substrate 128.

Continuing to refer to FIG. 1, the IC die 104 of the chip package 100 includes functional circuitry 106. The func-tional circuitry 106 may include block random access memory (BRAM), UltraRAM (URAM), digital signal pro-cessing (DSP) blocks, configurable logic elements (CLEs), and the like. The IC die 104 may be, but is not limited to, programmable logic devices, such as field programmable gate arrays (FPGA), memory devices, such as high band-width memory (HBM), optical devices, processors or other IC logic structures. The IC die 104 may optionally include optical devices such as photo-detectors, lasers, optical sources, and the like. In the example of FIG. 1, the IC die 104 is a logic die having math processor (also known as math engine) circuitry for accelerating machine-learning math operations in hardware, such as self-driving cars, artificial intelligence and data-center neural-network appli-cations.

Optionally, the at least one IC die 104 may be a plurality of IC dies 104. When a plurality of IC dies 104 are utilized, the IC dies 104 may be disposed in a vertical stack and/or disposed laterally side by side. It is contemplated that the IC dies 104 comprising the plurality of IC dies 104 may be the same or different types. Although only one IC die 104 is shown in FIG. 1, the number of IC dies 104 disposed in the chip package 100 may vary from one to as many as can fit within the chip package 100. Additionally, one or more of the IC dies 104 may optionally be configured as a chiplet.

The IC die 104 includes a die body 148 having a die bottom surface 152 and a die top surface 150. The functional circuitry 106 is disposed within the die body and includes routing that terminates on the die bottom surface 152 of the IC die 104, for example at contact pads (later shown in FIG. 2). In the example depicted in FIG. 1, the functional circuitry 106 includes voltage regulator switching circuitry 120 to which the embedded, off-die inductors 102, 112 are serially connected. Alternatively, the inductors 102, 112 may be coupled to other types of circuitry.

The RDL 116 is formed on the contact pads exposed on the die bottom surface 152 of the IC die 104. The RDL 116 includes routing formed from a plurality of patterned metal layers disposed between a plurality of dielectric layers. The patterned metal layers are coupled by vias to form intercon- nect circuitry 114 of the RDL 116. A portion of the inter- connect circuitry 114 include the first inductor 102. Thus, the portion of the interconnect circuitry 114 connects the func- tional circuitry 106 of the IC die 104 to package circuitry 182 formed in the package substrate 128 through the first inductor 102. In the example depicted in FIG. 1, the inter- connect circuitry 114 of the RDL 116 is electrically and mechanically coupled to the package circuitry 182 formed in the package substrate 128 by interconnects 108. In one example, the interconnects 108 are solder connections, such as solder bumps. The interconnects 108 may alternatively be formed by a hybrid bond layer or other suitable technique.

In some examples such as depicted in FIG. 1, the RDL 116 is wider than the IC die 104 to accommodate a fan out using interconnect circuitry 114 of the RDL 116. When the RDL 116 is wider than the IC die 104, a mold compound 118 surrounding the lateral sides of the IC die 104 may be utilized to provide structural support for portions of the RDL 116 that extend beyond the sides of the IC die 104.

Figure 2:
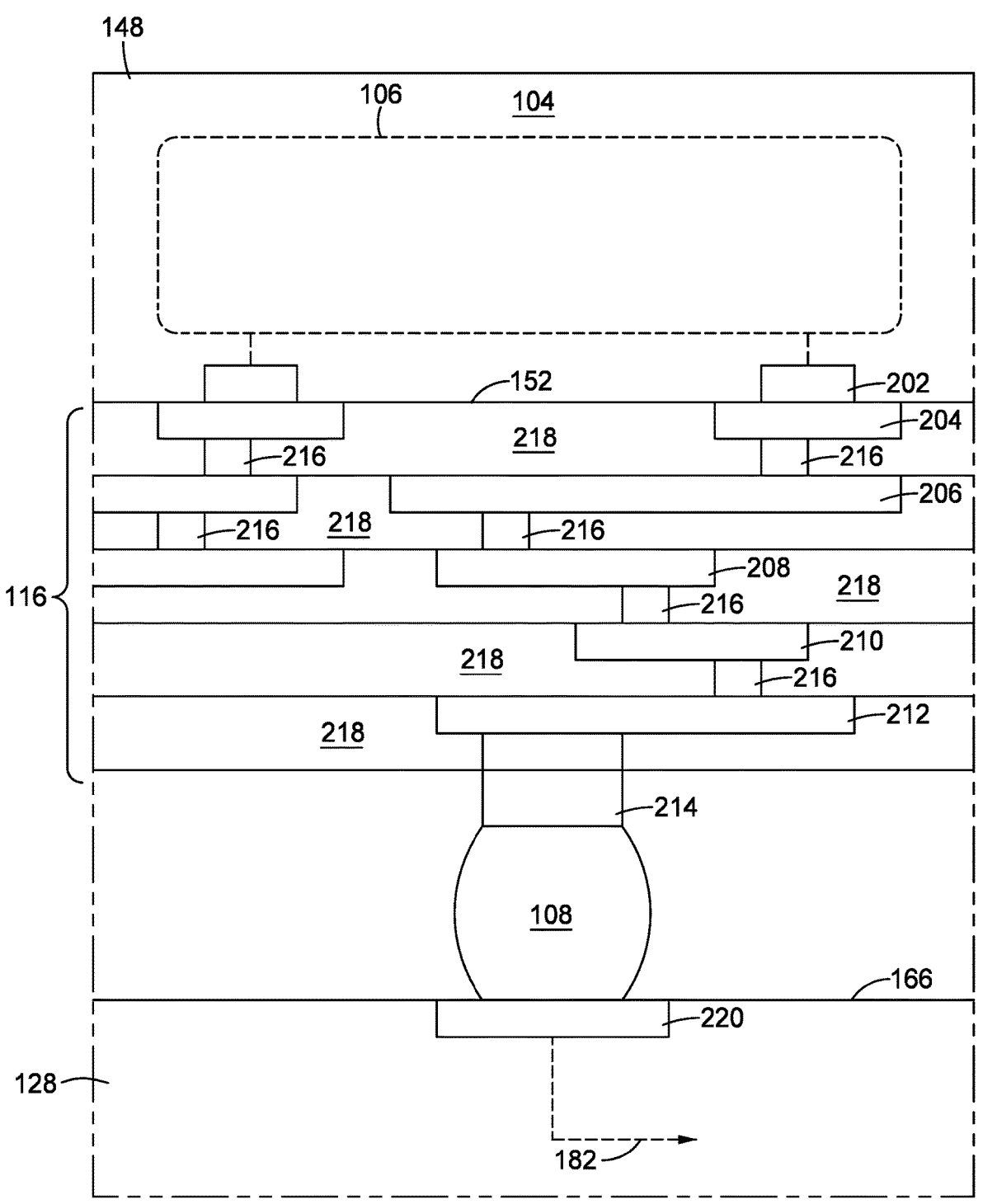
FIG. 2 is a schematic sectional view of a portion of the chip package illustrating one example of the connections between an integrated circuit (IC) die and a package sub-strate through a redistribution layer (RDL) that includes an embedded off-die inductor.

FIG. 2 is a schematic sectional view of a portion of the chip package 100 illustrating one example of the connec- tions between the IC die 104 and the package substrate 128 through the RDL 116.

The RDL 116 includes a plurality of conductive layers and vias 216 which are patterned to form the RDL circuitry 114. There can be between two to seven patterned conductive layers forming the RDL circuitry 114. In the example of FIG. 2, five conductive layers 204, 206, 208, 210, 212 are shown, although a different number of conductive layers may be utilized. The conductive layers 204, 206, 208, 210, 212 are patterned to form lines that are connected by vias 216 to form the RDL circuitry 114. The patterned conductive layers 204, 206, 208, 210, 212 are separated by dielectric layers 218.

The one end of the routings comprising the RDL circuitry 114 terminates at the first conductive layer 204. The routing terminations of RDL circuitry 114 at the first conductive layer 204 are coupled to contact pads 202 formed on the bottom surface 152 of the IC die 104. The other end of the routings comprising the RDL circuitry 114 terminates at the last conductive layer 212. The routing terminations of RDL circuitry 114 at the last conductive layer 212 are coupled to an under-bump layer 214 upon which the interconnect 108 is formed. The interconnect 108 couples the RDL circuitry 114 to a bond pad formed on a top surface 166 of the package substrate 128, thus connecting the RDL circuitry 114 to the package circuitry 182 of the package substrate 128. Although not show in FIG. 1, the first inductor 102 is part of the RDL circuitry 114 disposed in the RDL 116.

Returning back to FIG. 1, the package substrate 128 generally includes at least an upper build-up layer 122 disposed on a core 124. Optionally, a lower build-up layer

126 may be disposed on the other side of the core 124 from the upper build-up layer 122. The upper build-up layer 122 includes a plurality of conductive layers and vias that are patterned to provide routing of a portion of the package circuitry 182. One end of the package circuitry 182 formed in the upper build-up layer 122 terminates at the bond pad formed on the top surface 166 of the package substrate 128 where the package circuitry 182 connects to the interconnect circuitry 114 of the RDL 116. The other end of the package circuitry 182 formed in the upper build-up layer terminates at vias formed through the core 124. The lower build-up layer 126 may be fabricated similar to the upper build-up layer 122. At least one of the upper and lower build-up layers 122, 126 includes a fan out in the circuitry 114 of the package substrate 128.

In examples where the package substrate 128 does not include a lower build-up layer 126, the vias formed through the core 124 of the package circuitry 182 may be connected by solder balls 110 to circuitry 142 of the PCB 136 that terminates at a PCB top surface 170 of the PCB 136. In examples having a lower build-up layer 126, the vias formed through the core 124 are coupled through the patterned conductive layers and vias of the lower build-up layer 126 such that the package circuitry 182 terminates at a package bottom surface 168. At the package bottom surface 168, the package circuitry 182 is coupled to the circuitry 142 of the PCB 136 by the solder balls 140 (or alternatively via a socket).

Although the second inductor 112 is shown disposed embedded in the package substrate 128 in FIG. 1, the second inductor 112 may alternatively or additionally be located in other portions of the chip package 100 illustrated in FIG. 1, or other chip packages having alternative configurations. For example, the second inductor 112 may be formed in an interposer 190, as depicted in FIG. 1A.

Figure 1A:
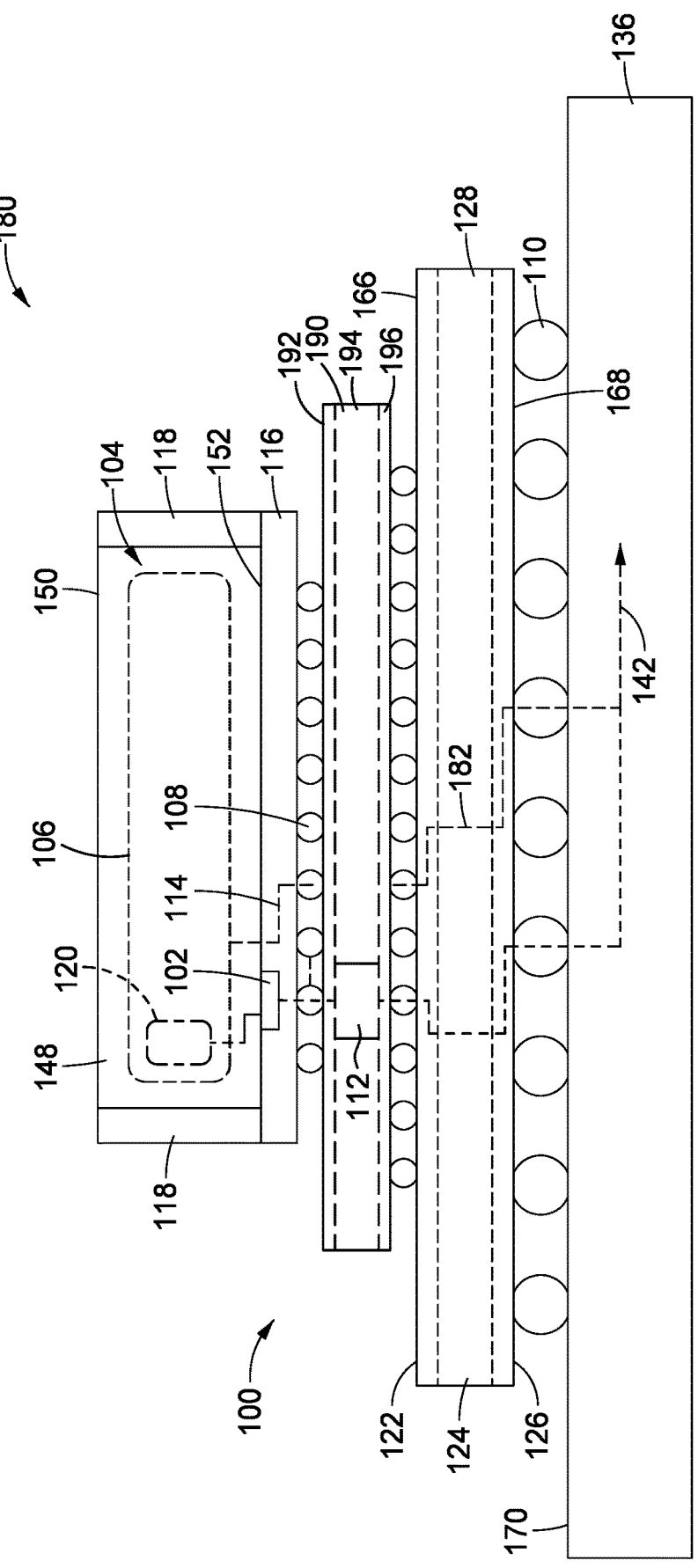
FIG. 1A is a schematic sectional view of another example of chip package having an off-die inductor disposed in a redistribution layer (RDL) disposed between an integrated circuit (IC) die and a package substrate of the chip package.

In FIG. 1A, the interposer 190 is shown disposed between the package substrate 128 and the IC die 104. Similar to the package substrate 128, the interposer 190 may include upper-build up layers 192, a core 194 and lower built-up layers 196. In one example, the second inductor 112 may be an air core inductor disposed in the interposer 190 and formed using vias passing through the core 194.

Additionally, although the first inductor 102 is shown disposed embedded in the RDL 116 in FIG. 1, the first inductor 102 may alternatively or additionally be located in other portions of the chip package 100 illustrate in FIG. 1, or other chip packages having alternative configurations. For example, the first inductor 102 may be formed in any one of the build-up layers 122, 126, 192, 196. In other examples, the first inductor 102 may be at least partially formed in one of the cores 124, 194.

Returning to the primary example depicted in FIG. 1, the second inductor 112 is disposed in the package substrate 128. The second inductor 112 may be disposed in a cavity formed in the core 124 of the package substrate 128, formed from the lines and vias forming the circuitry 114 of the package substrate 128. The second inductor 112 generally has a greater size and/or inductance relative to the first inductor 102. For example, the second inductor 112 may have an inductance that is up to 20 percent greater than an inductance of the first inductor 102. In another example, the second inductor 112 has an inductance that is at least one order of magnitude great than an inductance of the first inductor 102. In examples where multiple inductors 102, 112 are utilized, the pitch between first inductors 102 may be 5 for more times than the pitch between the second inductors 112. In some examples, the second inductor 112 has a single loop while the first inductor 102 has multiple loops.

Returning to the construction of the first inductor 102, the first inductor 102 is generally formed from the patterned metal layers comprising the RDL 116. In this manner, the first inductor 102 may be formed immediately adjacent the IC die 104 for improved performance, while freeing space within the IC die 104 that can be used for additional IC device, power routing and the like. Additionally, since the first inductor 102 is disposed between the package substrate 128 and the IC die 104, the signal path through the inductors 102, 112 to the IC die 104 is very short, thus reducing power consumption, enhancing speed, and conserving space for other routings.

Figure 3:
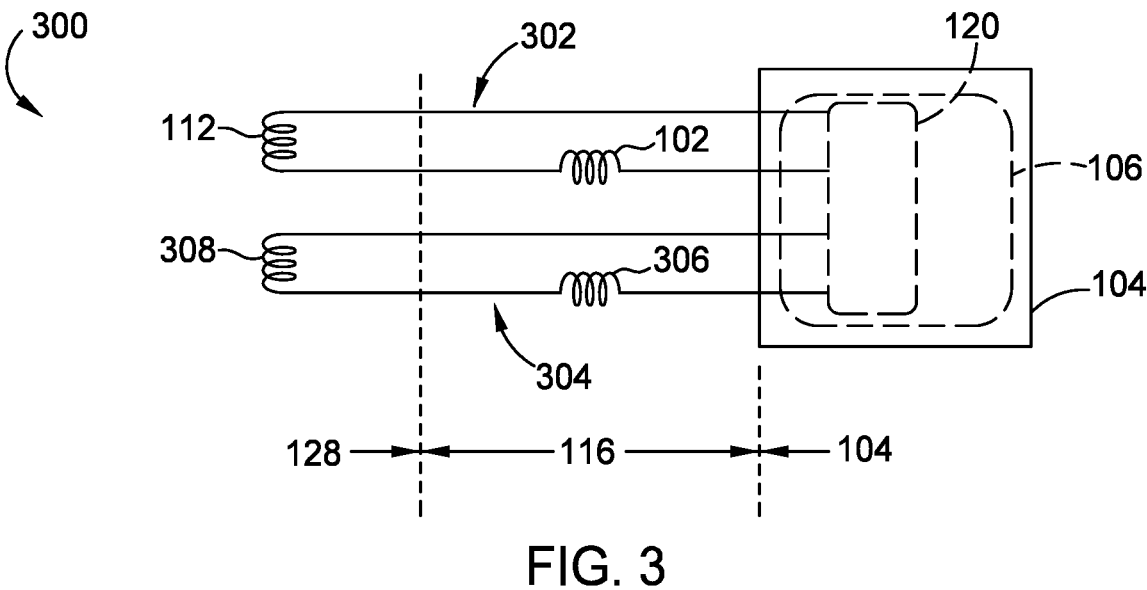
FIG. 3 is a schematic circuit diagram of signal paths through series connected embedded off-die inductors.

FIG. 3 is a circuit schematic 300 illustrating a chip package having two embedded off-die inductors. The circuit schematic 300 is representative of, as but not limited to, the chip package 100 having the two embedded off-die inductors 102, 112. In the circuit schematic 300 depicted in FIG. 3, there are at least two signal paths 302, 304, which contain at least two embedded off-die series coupled inductors 102,112. For example, a first signal path 302 includes a first inductor 102 embedded in a substrate and a second inductor 112 embedded in the RLD 116. The substrate in which the first inductor 102 is embedded may be a package substrate 128 or interposer 190. The second signal path 304 includes a third inductor 306 in the same substrate as the first inductor 102, and a fourth inductor 308 embedded in the RLD 116. The third inductor 306 is constructed similar to the first inductor 102, while the fourth inductor 308 is constructed similar to the second inductor 112. The second signal path 304 may be disposed immediately adjacent the first signal path 302, such example such that the second inductor 112 is immediately adjacent the fourth inductor 308 within the same substrate.

Optionally, the first signal path 302 may include more than one inductor 102 in the RDL 116 and/or more than one inductor 112 in the package substrate 128 (or interposer 190). The second signal path 302 may also optionally include more than one inductor 102 in the RDL 116 and/or more than one inductor 112 in the package substrate 128 (or interposer 190).

The coil comprising the second inductor 112 may optionally be wound in a direction opposite that of the coil comprising the fourth inductor 308. In this manner, the first signal path 302 defined through the first and second series connected inductors 102, 112 are configured to transmit signals having a different voltage domains and/or different voltage phases than the second signal path 304 defined through the third and fourth series connected inductors 306, 308.

Figure 4:
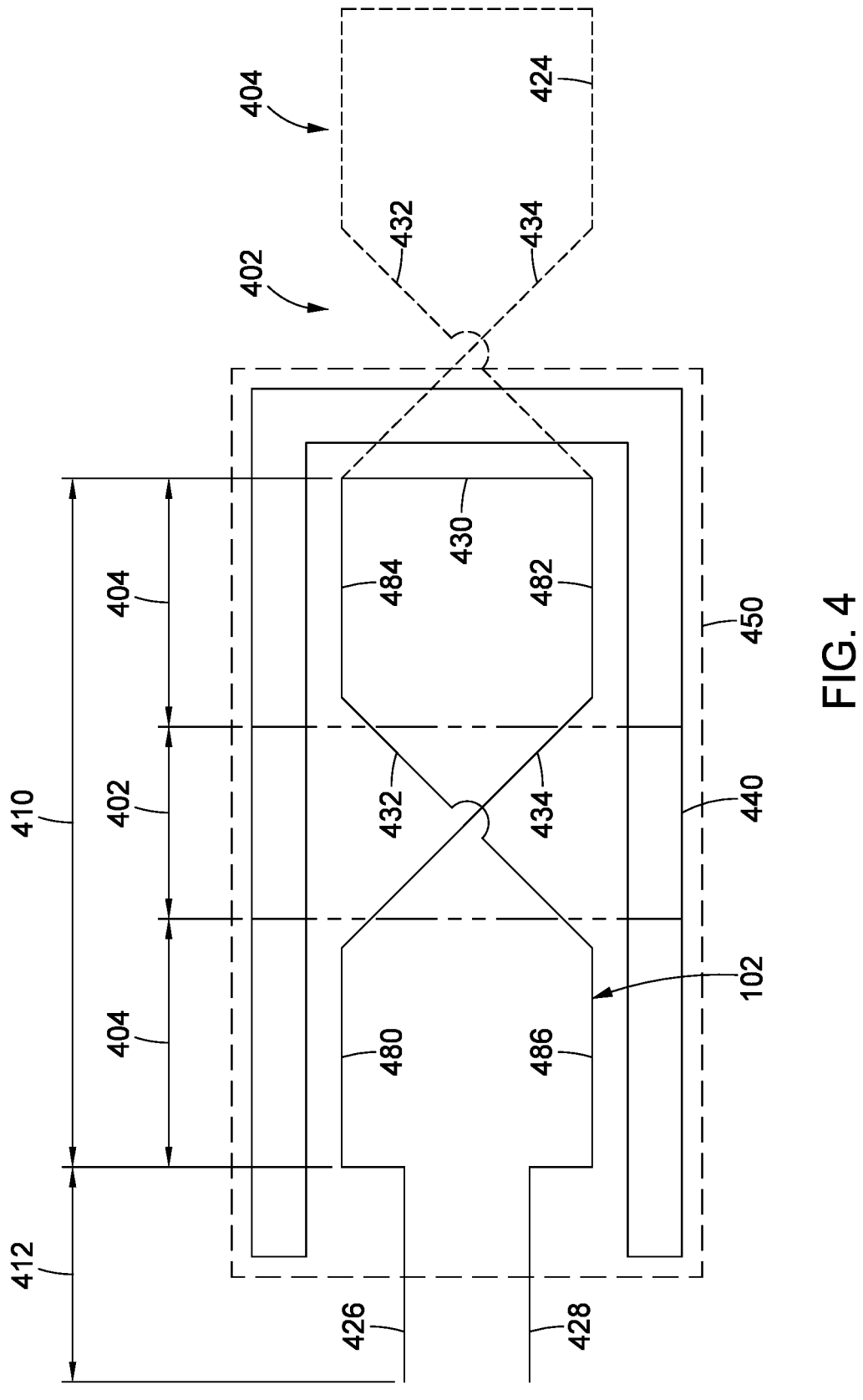
FIG. 4 is a schematic circuit diagram of an off-die inductor embedded in redistribution layer (RDL).

FIG. 4 is a schematic circuit diagram of one example of a first inductor 102 that can be fabricated in an RDL 116. It is contemplated that off-die inductors having other configurations may be fabricated within the patterned metal layers of the RDL 116.

The first inductor 102 generally includes a head region 410 and a tail region 412. The tail region 412 generally includes leads 426, 428 that define the terminal ends of the first inductor 102. The head region 410 includes loop regions 404 separated by cross over region 402. Generally, there are N cross over region 402 and N+1 loop regions 404, where N is a whole number greater than zero. For example, N may equal 1, 2, 4 or other suitable whole number greater than zero.

The head region 410 generally includes at least two or more connected loops (e.g., coils). In the example depicted in FIG. 4, two coils 420, 422 are shown. Each coil 420, 422 resides in a respective one of the loop regions 404. A third coil 424 is shown in phantom connected on one of the coils 420, 422. Additional loops may be connected to the third coil 424 as desired. As the coils 420, 422 are connected with the second coil 422 separated from the tail region 412 by the first coil 420, the head region 410 generally has a high aspect ratio with the length of the head region 410 (in the direction of loop connections) being at least 4 times greater than the width of the head region 410 (in the perpendicular to the direction of loop connections).

The first coil 420 is coupled to each of the leads 426, 428 that define the terminal ends of the first inductor 102. The first coil 420 is coupled to the second coil 422 at the cross over region 402. The cross over region 402 allows a portion of the first coil 420 terminating at the first lead 426 to jump over the portion of the first coil 420 terminating at the second lead 428 at the interface between the coils 420, 422. The cross over region 402 jumps the traces comprising the first inductor 102 by utilizing different metal layers of the RDL 116, as will be detailed further below with reference to FIGS. 5-10.

In the example depicted in FIG. 4, the trace metal comprising the first inductor 102 begins at the lead 426 and extends out of the tail region 412 to connect to a first portion 480 of the first coil 420 disposed in the loop region 404 of the head region 410 closest the tail region 412. The trace metal comprising the first portion 480 of the first coil 420 connects to a first jumper trace 434 disposed in the cross over region 402 of the first inductor 102. The trace metal comprising the first jumper trace 434 connects to a first portion 482 of the second coil 422 disposed in the second loop region 404. If only two coils 420, 422 are utilized, the first portion 482 of the second coil 422 is connected to a second portion 484 of the second coil 422 by a connection trace 430. If more than two coils 420, 422 are utilized, the first portion 482 of the second coil 422 is connected to a jumper 432 in the next coil 424, and another jumper 434 connects the coil 424 back to the second coil 422. If more than three coils are utilized, the additional coils are connected in the same manner. The trace metal comprising the second portion 484 of the second coil 422 connects to a second jumper 432 disposed in the cross over region 402 of the first inductor 102. The trace metal comprising the second jumper 432 connects to a second portion 486 of the first coil 420 disposed in the first loop region 404 of the first inductor 102. The trace metal comprising the second portion 486 of the first coil 420 extends out of the head region 410 and into tail region 412 to connect to the second lead 428.

The head region 410 of the first inductor 102 may be aligned with an optional ground plane 450 (shown in phantom in FIG. 4). The ground plane 450 is also fabricated from one or more of the metal layers of the RDL 116. The ground plane 450 has an area that is larger than an area of the loop and cross over regions 402, 404. In one example, the area of the ground plane 450 is larger than an area of the head region 410. The ground plane 450 may be positioned in the RDL 116 such that the ground plane 450 separates the first inductor 102 from the IC die 104. The ground plane 450 is coupled to ground either through the IC die 104 or through the circuitry 114 of the RDL 116 such that the ground plane 450 attenuated and/or protects the functional circuitry 106 of the IC die 104 from electrical and magnetic fields within the chip package 100. The one or more metal layers of the RDL 116 comprising the conductive ground plane 450 may be in the form of a mesh, include a plurality of apertures, holes, have interleaved fingers, be solid or have another suitable configuration.

The head region 410 of the first inductor 102 may also include an optional shield 440 (shown in phantom in FIG. 4). The shield 440 may be utilized with or without the optional ground plane 450. The shield 440 is fabricated from one or more of the metal layers of the RDL 116. The shield 440 may be coupled to the ground plane 450, when present. The shield 440 generally circumscribes at least 4 sides of the head region 410, and in some embodiments, circumscribes the entire inductor 102. The shield 440 is coupled to ground either through one or more of the IC die 104, the ground plane 450 or through the circuitry 114 of the RDL 116. The shield 440 is formed from one or more metal layers of the RDL 116. In one example, the shield 440 comprises portions of the same metal layers comprising the first inductor 102. As later described below, when the shield 440 is fabricated from multiple metal layers of RDL 116, the multiple metal layers comprising the shield 440 are interconnected by conductive vias within the RDL 116. The shape of the shield 440 may be rectangular, follow the shape of the first inductor 102, or other another suitable shape.

Figure 17:
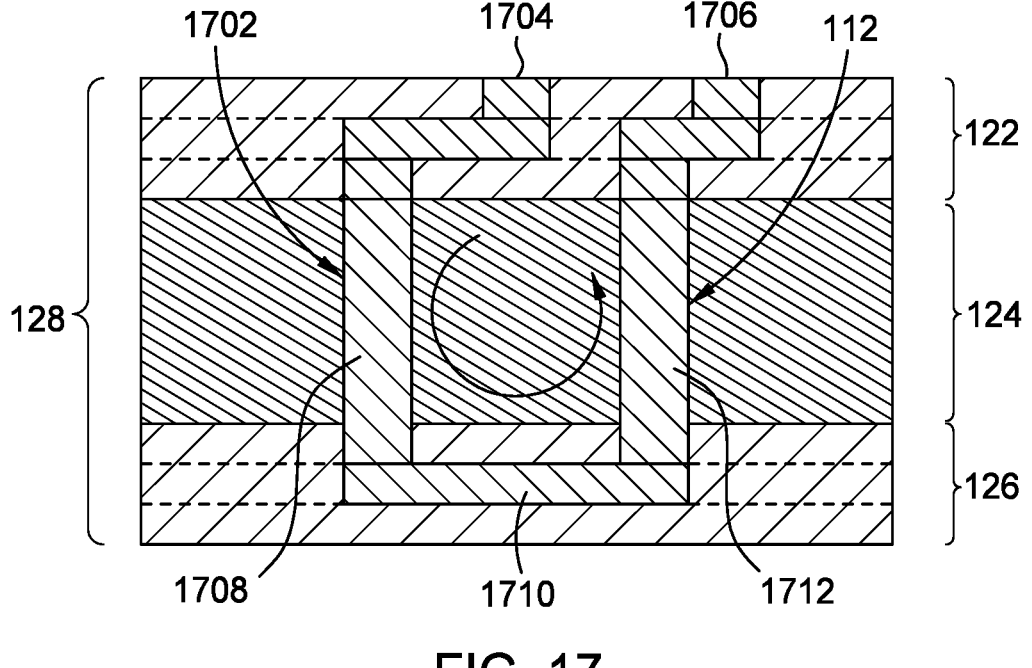
FIG. 17 is a schematic sectional view of an off-die inductor embedded in a substrate, such as a package sub-strate or an interposer.
Figure 18:
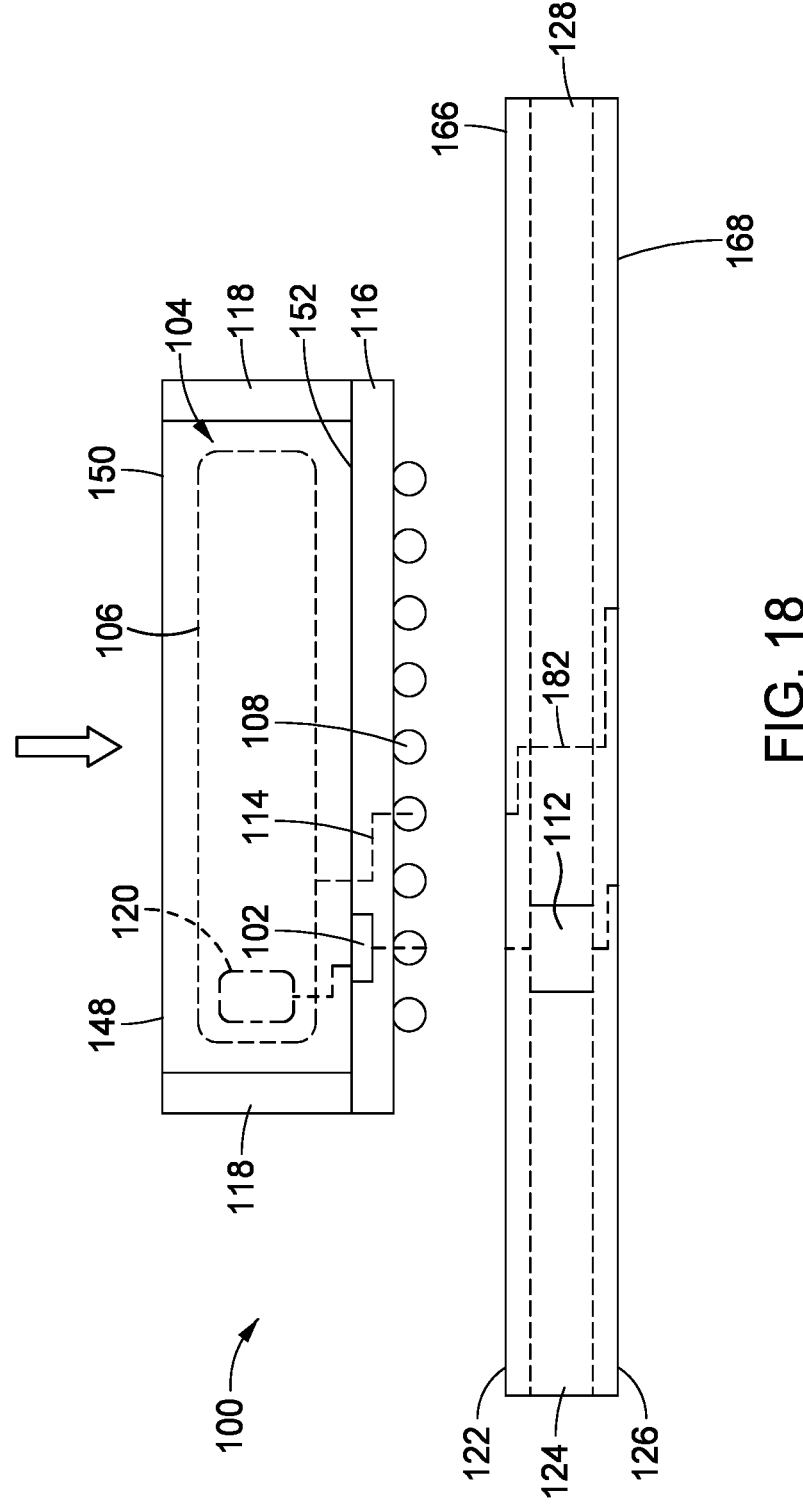
FIG. 18 is a schematic sectional view of a substrate, such as a package substrate or an interposer, having an embedded off-die inductor stacked with a redistribution layer (RDL) that also includes an embedded off-die inductor.

FIG. 19 is a flow diagram of a method 1900 for fabricating a chip package 100 having a first inductor 102 disposed within a redistribution layer (RDL) 116 adjacent an integrated circuit (IC) die 104 that is coupled in series with a second inductor 112 formed in a substrate, such as a package substrate 128 or an interposer 190. FIGS. 5-10 are a sequence of schematic bottom views depicting the first inductor 102 during various stages of fabrication within the RDL 116 during portions of the method 1900 described below. FIG. 17 is a schematic diagram of one example of the second inductor 112 embedded in a substrate, such as a package substrate 128 or an interposer 190. FIG. 18 is a schematic diagram of one example of the substrate and RDL 116 being stacked to couple the embedded off-die inductors 102, 112 in series. The chip packages having off-die embedded inductors 102, 112 fabricated within the RDL may also be fabricated utilizing different techniques.

The method 1900 begins at operation 1920 by forming the first inductor 102 in a RDL 116 formed on the IC die 104. The first inductor 102 is generally formed from the conductive layers and via that formed the circuitry 114 of the RDL 116. One non-limiting example of operation 1920 is described below with reference to operations 1902-1914 below.

Figure 5:
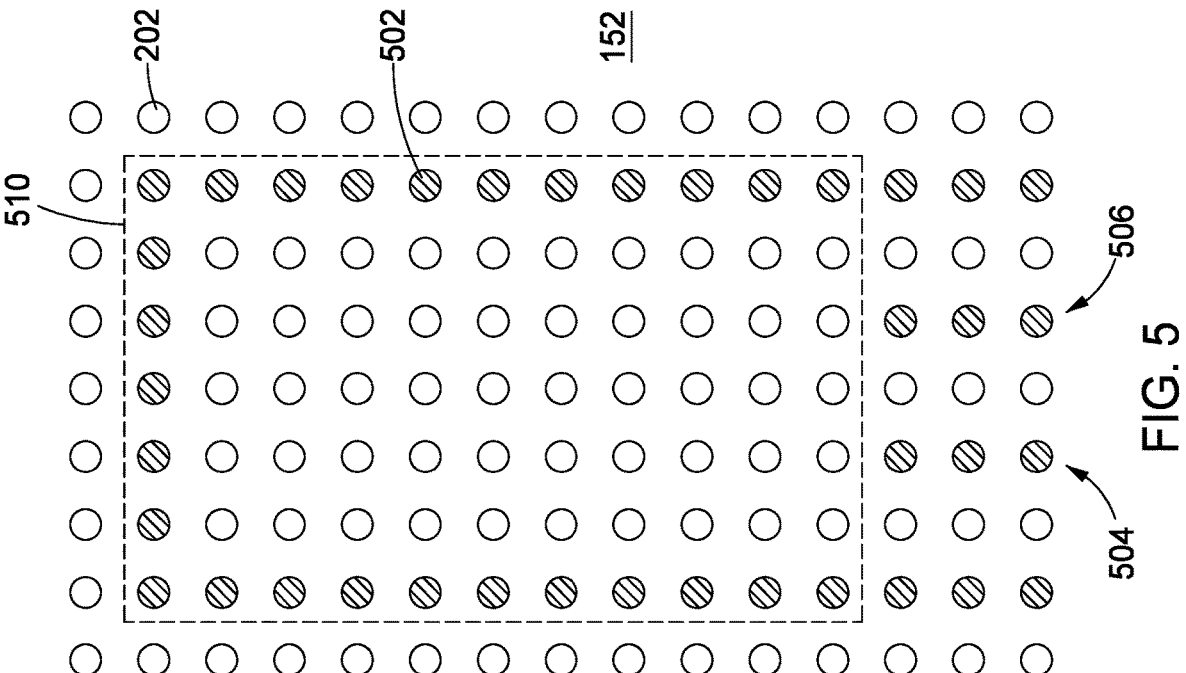

At operation 1902, a first plurality of vias 502, a second plurality of vias 504, and a third plurality of vias 504 are formed on the contact pads 202 of the IC die 104, as shown in FIG. 5. The first plurality of vias 502 are coupled to ground circuitry of the IC die 104, and will become part of the shield 440 (also as shown in FIG. 4). The second plurality of vias 504 are coupled later coupled to the second inductor 112, and will become part of the first lead 426 of the first inductor 102 as shown in FIG. 4. The third plurality of vias 506 are coupled to functional circuitry 106 of the IC die 104, and will become part of the second lead 428 of the first inductor 102, also as shown in FIG. 4. Alternatively, the vias 504, 506 may be coupled to contact pads 502 connected to other types of circuitry/devices within the IC die 104. In one example, the vias 502, 504, 506 are plated on the contact pads 202. An edge of the ground plane 450 closest to the tail region 412 is shown in phantom in FIGS. 8-10.

The area inside, i.e., bounded by, the vias 502 is utilized to form the coils 220, 222 of the first inductor 102. As depicted in FIG. 5 using the rows and columns of contact pads 202 disposed inside the vias 502, the area available to form the coils 220, 222 (i.e., the head region 410) of the first inductor 102 has a high aspect ratio. That is, the number rows (in a direction away from the tail region 412) utilized to form the width of the head region 410 of the first inductor 102 is greater than the number of columns utilized to form the height of the head region 410. The height of the head region 410 can easily be increase to accommodate more than two coils 220, 222, while still retaining a narrow width. In one example, the width of the two coils 220, 222 is less than three pitches of the contact pads 202. In another example, the width of the two coils 220, 222 is less than four or five pitches of the contact pads 202. In another example, the height of the two coils 220, 222 is great than or equal to five pitches of the contact pads 202. In still another example, the aspect ratio defined using the pitch of rows to columns of contact pads 502 within head region 410 containing the two coils 220, 222 is greater 5:2 or greater than 5:3.

The dashed line 510 depicted in FIG. 5 illustrates the bounds of the ground plane 450, which is later formed at operation 1904. The contact pads 202 of the IC die 104 circumscribed by the dashed line 510 are dummy pads, i.e., not electrically connected to the circuitry 114 of the RDL 116.

The contact pads 202 of the IC die 104 outward of the dashed line 510 may be dummy pads, signal transmission pads, ground pads, or power pad. As the type of contact pads 202 outward of the dashed line 510 is not generally pertinent to the construction of the first inductor 102, these pads 202 are illustrated as, but limited to, dummy contact pads.

At operation 1902, a dielectric layer 218 is disposed around the vias 502, 504, 506. Alternatively, the dielectric layer 218 may be disposed and patterned on the bottom surface 152 of the IC die, then the vias 502, 504, 506 deposited in the patterned openings formed in the dielectric layer 218.

Figure 6:
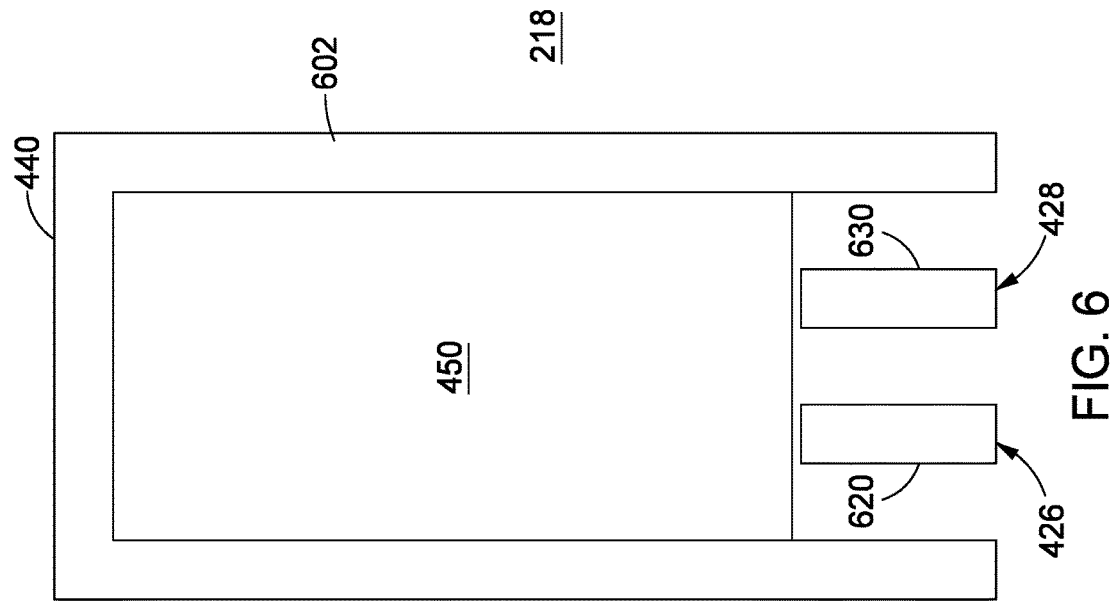
FIGS. 5-10 are a sequence of schematic bottom views depicting an off-die inductor various stages of fabrication within the redistribution layer (RDL).

At operation 1904, metal traces 602 are formed on the first vias 502, as illustrated in FIG. 6. The metal traces 602 are fabricated from the first metal layer 204 of the RDL 116, and form a portion of the shield 440. The metal traces 602 may be solid, a mesh or has another suitable geometry.

Also at operation 1904, a portion of the first metal layer 204 of the RDL 116 may also be utilized to form the optional ground plane 450. The ground plane 450 and the shield 440 may be formed from a contiguous portion of the first metal layer 204 of the RDL 116. Although the ground plane 450 is illustrated in FIG. 6 as a solid planar sheet of metal material, the ground plane 450 may alternatively may be a mesh, include a plurality of apertures, holes, have interleaved fingers, or have another suitable configuration.

Also at operation 1904, a portion of the first metal layer 204 of the RDL 116 forms a trace 620 over and interconnecting the second vias 504. A portion of the first metal layer 204 of the RDL 116 also forms a trace 630 over and interconnecting the third vias 506. The traces 620, 630, being part of the leads 426, 428 of the first inductor 102, are spaced and isolated from each other, and also spaced and isolated from ground plane 450 and the shield 440.

Figures 7, 8:
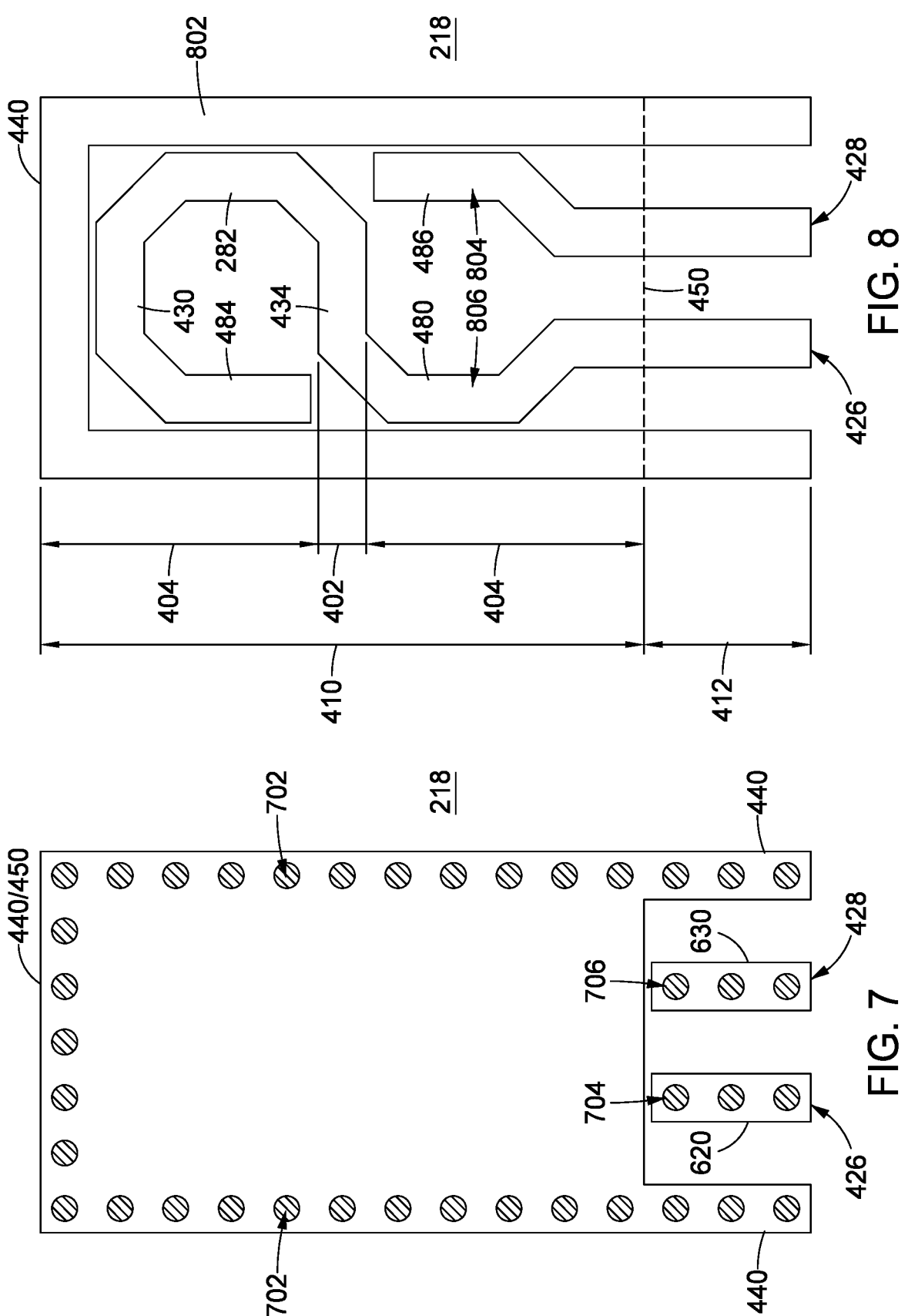

At operation 1906, a first plurality of vias 702, a second plurality of vias 704, and a third plurality of vias 704 are formed, as shown in FIG. 7. The first plurality of vias 702 are formed on the metal traces 602 and are aligned with the first plurality of vias 502. The first plurality of vias 702, the metal traces 602, and the first plurality of vias 502 form a portion of the shield 440 (also as shown in FIG. 4).

The second plurality of vias 704 are formed on the metal trace 604 and are aligned with the second plurality of vias 504. The second plurality of vias 704, the metal trace 604, and the second plurality of vias 504 form a portion of the first lead 426 of the first inductor 102.

Similarly, the third plurality of vias 706 are formed on the metal trace 606 and are aligned with the third plurality of vias 506. The third plurality of vias 706, the metal trace 606, and the third plurality of vias 506 form a portion of the second lead 428 of the first inductor 102.

After operation 1906 is complete, another dielectric layer 218 is disposed around the vias 702, 704, 706. The vias 702, 704, 706 may be fabricated similar to the vias 502, 504, 506.

At operation 1908, metal traces 802, 804 and 806 are formed from the metal layer 206 of the RDL 116 that is disposed next to the metal layer 204, as illustrated in FIG. 8. The metal traces 802 form a portion of the shield 440. The metal traces 802, 804 and 806 may be solid, a mesh or has another suitable geometry. The metal traces 804 and 806 are isolated from the ground plane 450 by one of the dielectric layers 218.

The metal traces 802 are formed on the first plurality of vias 702. The metal traces 802 and vias 702 form part of the shield 440.

Also at operation 1908, a portion of the metal layer 206 of the RDL 116 forms a trace 804 over and interconnecting the third plurality of vias 706. The trace 804 extends out of the tail region 412 into the head region 410. The trace 804 also forms the second portion 486 of the first coil 420 in the loop region 404. The trace 804 terminates at or slightly within the cross over region 402.

Also at operation 1908, a portion of the metal layer 206 of the RDL 116 forms the trace 806 over and interconnecting the second vias 704. The trace 806 extends out of the tail region 412 into the head region 410. The trace 806 also forms the first portion 480 of the first coil 420 in the loop region 404. The trace 806 extends from the first portion 480 of the first coil 420 into the cross over region 402, and forms the jumper 434. The jumper 434 is not connected to any vias. The trace 806 extends from the jumper 434 in the cross over region 402 to the first portion 482 of the second coil 422 in the second loop region 404. As part of the second coil 422, the trace 806 also includes the connection trace 430 and the second portion 484 of the second coil 422. The trace 806 terminates at or slightly within the cross over region 402.

Figures 9, 10:
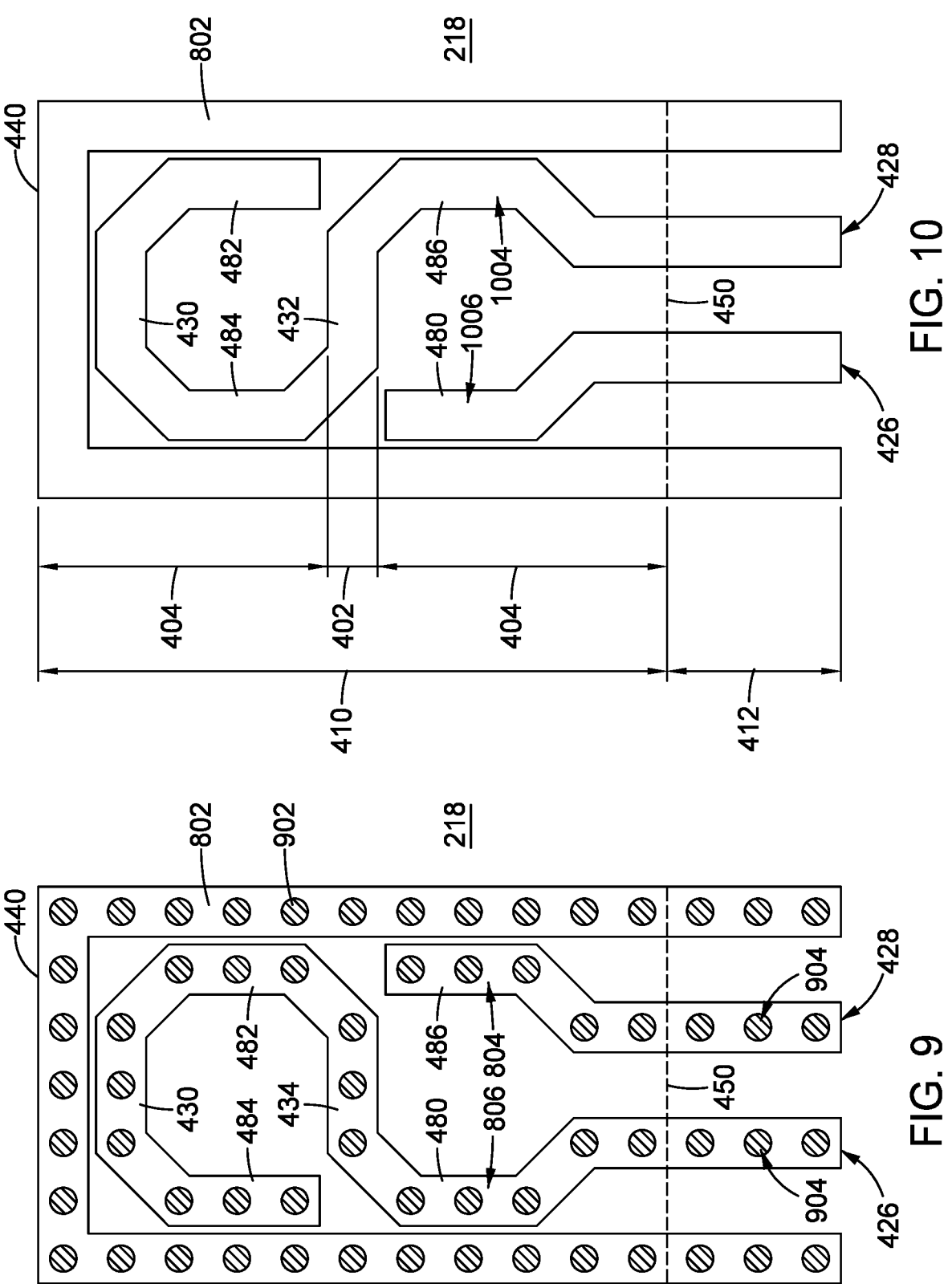
Figure 12:
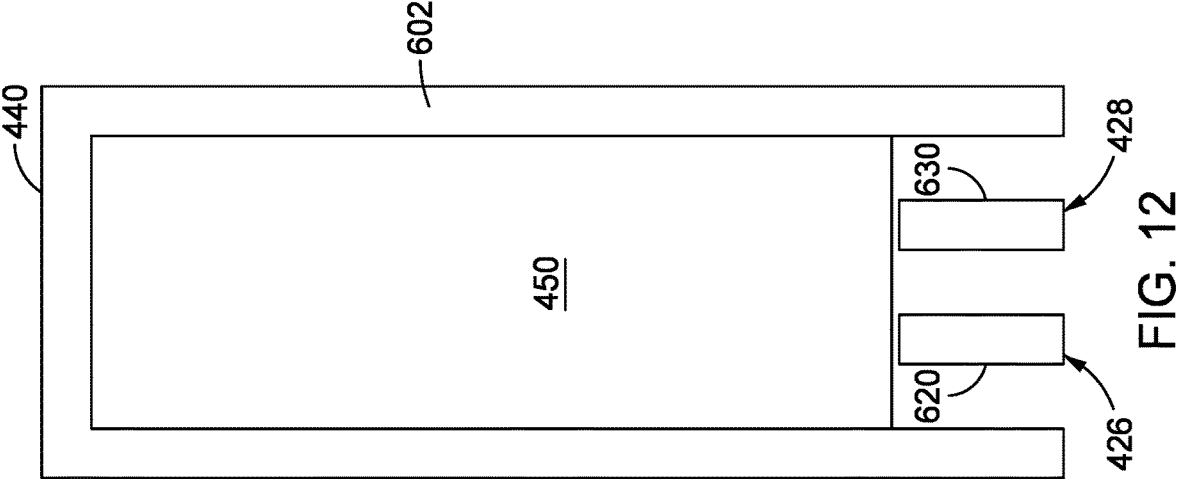
FIGS. 11-16 are a sequence of schematic bottom views depicting another off-die inductor various stages of fabrica-tion within the redistribution layer (RDL).
Figure 11:
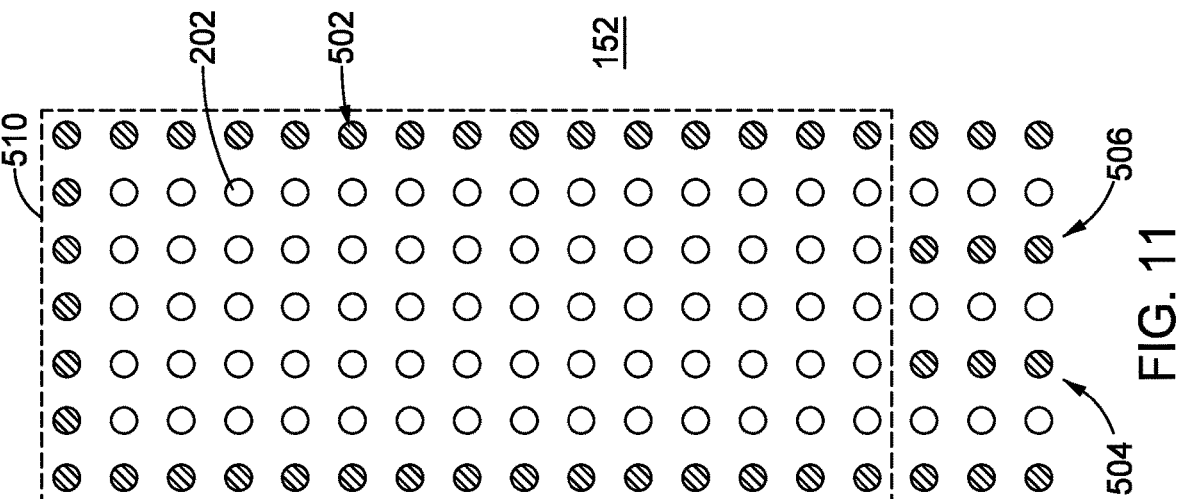

At operation 1910, a first plurality of vias 902, a second plurality of vias 904, and a third plurality of vias 904 are formed, as shown in FIG. 9. The first plurality of vias 902 are formed on the metal traces 802, and are aligned with the first plurality of vias 702. The first plurality of vias 902, the metal traces 802, and the first plurality of vias 702 form a portion of the shield 440 (also as shown in FIG. 4).

The second plurality of vias 904 are formed on the metal trace 804 and are aligned with the second plurality of vias 704. The second plurality of vias 904, the metal trace 804, and the second plurality of vias 704 form a portion of the first lead 426 of the first inductor 102.

Similarly, the third plurality of vias 906 are formed on the metal trace 806 and are aligned with the third plurality of vias 706. The third plurality of vias 906, the metal trace 806, and the third plurality of vias 706 form a portion of the second lead 428 of the first inductor 102.

After operation 1910 is complete, another dielectric layer 218 is disposed around the vias 902, 904, 906. The vias 902, 904, 906 may be fabricated similar to the vias 702, 704, 706.

At operation 1912, metal traces 1002, 1004 and 1006 are formed from the metal layer 208 of the RDL 116 that is disposed next to the metal layer 206, as shown in FIG. 10. The metal traces 1002, 1004 and 1006 may be solid, a mesh or has another suitable geometry. The metal traces 1004 and 1006 are separated from the traces 804, 806, except where interconnected by vias 904, 906 and the jumpers 432, 434 by one of the dielectric layers 218

The metal traces 1002 form a portion of the shield 440. The metal traces 1002 may be solid, a mesh or has another suitable geometry.

Also at operation 1912, a portion of the metal layer 208 of the RDL 116 forms the trace 1004 over and interconnecting some of the third plurality of vias 904 and the second plurality of vias 904. The trace 1004 extends out of the tail region 412 into the head region 410. The trace 1004 also forms the second portion 486 of the first coil 420 in the loop region 404. The portion of the trace 1004 disposed in the first coil 420 in the loop region 404 are coupled to the trace 804 by the second plurality of vias 904. The trace 1004 extends from the second portion 486 of the first coil 420 into the cross over region 402 and forms the jumper 432. The portion of the trace 1004 disposed in the cross over region 402 is not coupled to any vias such that the jumper 432 is separated from the jumper 434 by one of the dielectric layers 218 of the RDL 116. The trace 1004 extends from the jumper 432 in the cross over region 402 to the second portion 484 of the second coil 422 in the second loop region 404. As part of the second coil 422, the trace 1004 also includes the connection trace 430 and the first portion 482 of the second coil 422. The trace 1004 terminates at or slightly within the cross over region 402. The portion of the trace 1004 disposed in the second coil 422 in the loop region 404 are coupled to the trace 806 by the second plurality of vias 904.

Also at operation 1912, a portion of the metal layer 208 of the RDL 116 forms the trace 1006. The trace 1006 forms part of the first coil 420, and is connected to the portion of the trace 806 that also forms part of the first coil 420 by the second plurality of vias 904 that are disposed in the loop region 404 in which the first coil 420 resides. The trace 1006 also forms part of the lead 426.

Thus, after deposition of the traces 1004, 1006, the first inductor 102 starts at lead 426, extends through the traces 806, 1006 forming part of the first coil 420, then across the jumpers 434 to the second coil 422. In the region of the second coil 422, the first inductor 102 includes portion of the traces 806, 1004 coupled by vias 904. The second coil 422 is coupled by the jumper 432 to a portion of the first coil 420 that includes the trace 804 and a portion of the trace 1004 that are coupled by vias 906. The portion of the first coil 420 that includes the via connected traces 804, trace 1004 extends from the loop region 404 and into the tail region 412, terminating at the second lead 428.

At operation 1914, the RDL 116 is completed. Completing the RDL 116 may include depositing additional patterned metal layers and dielectric layers necessary to complete the circuitry 114 of the RDL 116.

At operation 1930, a substrate containing the second inductor 112 is mechanically and electrically coupled to the RDL 116 to form the chip package 100, as shown in FIG. 18. The substrate, as noted above, may be the package substrate 128 or interposer 190. The substrate may be mechanically and electrically coupled to the RDL 116 via interconnects 108, such as by reflowing solder bumps to connect the circuitry 114 of the package substrate 128 to the circuitry 106 of the IC die 104 through the circuitry 114 of the RDL 116. Alternatively, the interconnects 108 mechanically and electrically coupling the substrate to the RDL 116 may be in the form of a hybrid bond. Coupling the substrate to the RDL 116 also electrically connects the first inductor 102 to the second inductor 112.

An example of the second inductor 112 embedded in a substrate is depicted in the schematic diagram of FIG. 17. Although in the example depicted in FIG. 17 the substrate is illustrated as a package substrate 128, the second inductor 112 may alternatively be embedded in an interposer 190 such as illustrated in FIG. 1A.

Continuing to refer to FIG. 17, the second inductor 112 is shown as an air core inductor. The second inductor 112 includes at least one coil 702. Although one coil 702 is shown in FIG. 17, additional coils 702 may be coupled in series to form the second inductors 112. The coil 702 illustrated in FIG. 17 includes an input lead 704, an output lead 706, a first via 1708, a jumper 1710, and a second via 1712. The input lead 704 and the output lead 706 are formed in the upper build-up layer 122 of the package substrate 128. One end of input lead 704 is connected to the functional circuitry 106 of the IC die 104. In one example, the input lead 704 is connected to voltage regulator switching circuitry 120 residing in the functional circuitry 106 of the IC die 104. In other examples, the input lead 704 may be connected to a different type of circuitry residing in the functional circuitry 106 of the IC die 104. The other end of input lead 704 is connected to the first via 1708.

The first and second vias 1708, 1712 are formed in the core 124 of the package substrate 128. The first and second vias 1708, 1712 are generally spaced apart in a parallel orientation. The ends of the vias 1708, 1712 farthest from the RDL 116 are coupled by the jumper 1710. The jumper 1710 is formed in the lower build-up layer 126 of the package substrate 128, but may alternatively be in a different location.

The end of the second via 1712 closest the RDL 116 is connected to the output lead 1706. The output lead 1706 is connected to the second lead 428 of the first inductor 102, thus coupling the inductors 102, 112 in series.

At an optional operation 1940, the chip package 100 is mechanically and electrically coupled to a PCB 136 to form an electronic device 180.

Although the method 1900 for fabricating a chip package 100 having a first inductor 102 fabricated within a redistribution layer (RDL) 116 adjacent an integrated circuit (IC) die 104 was described above with an exemplary first inductor 102 having two coils 420, 422, the operation 1910 of the method 1900 may also be utilized to form a first inductor 102 having three or more coils. FIGS. 11-16 are a sequence of schematic bottom views depicting formation of a three coil first inductor 102 during various stages of fabrication. Additionally coils may also be added in the same manner.

Operations 1902, 1904, 1906 of the method 1900 are as described above, and also shown in FIGS. 11, 12 and 13.

Figure 14:
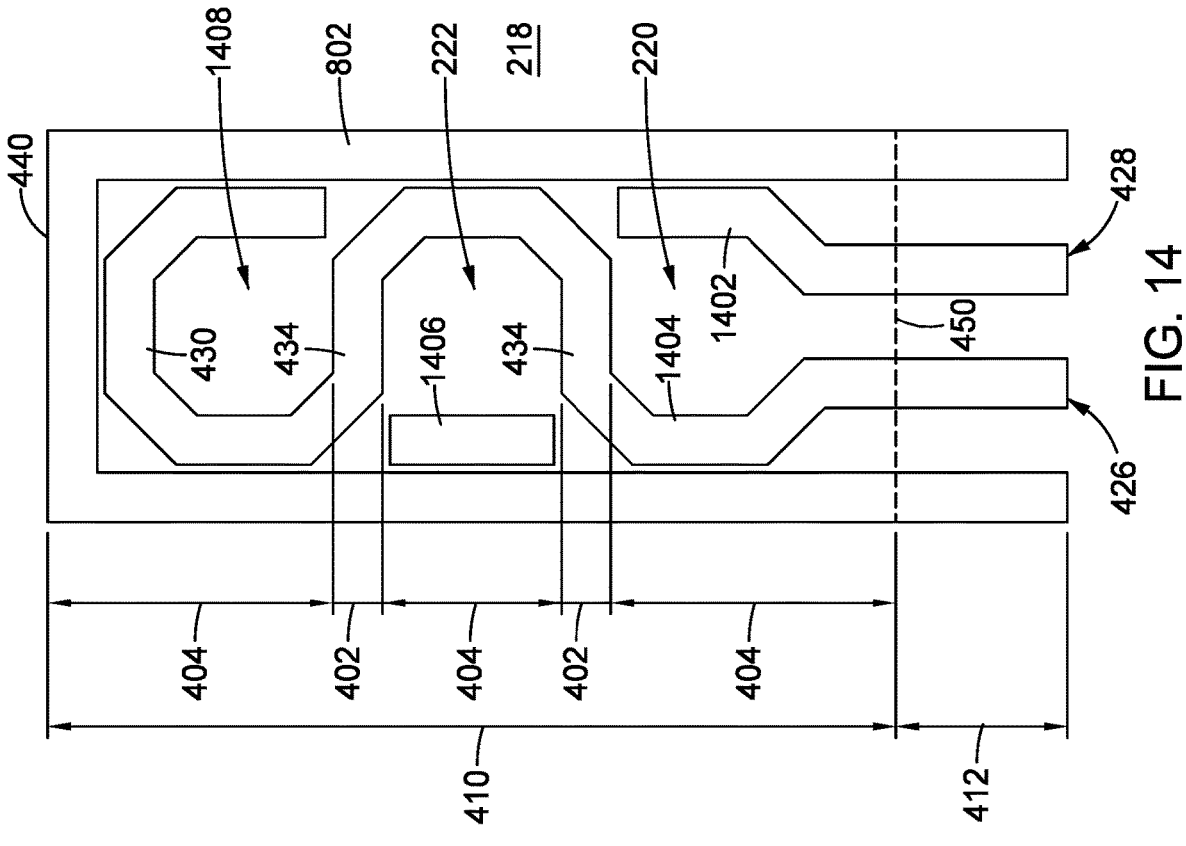
Figure 13:
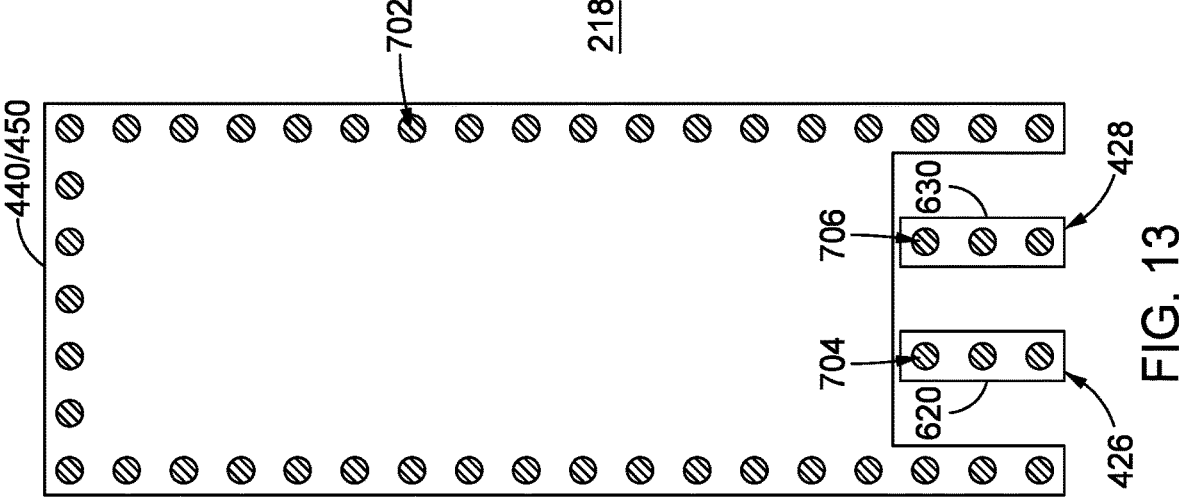

At operation 1908, metal traces 802, 1402, 1404 and 1406 are formed from the metal layer 206 of the RDL 116 that is disposed next to the metal layer 204, as illustrated in FIG. 14. The metal traces 802 form a portion of the shield 440. The metal traces 802, 1402, 1404 and 1406 may be solid, a mesh or has another suitable geometry. The metal traces 1402, 1404 and 1406 are isolated from the ground plane 450 by one of the dielectric layers 218.

The metal traces 802 are formed on the first plurality of vias 702. The metal traces 802 and vias 702 form part of the shield 440.

Also at operation 1908, a portion of the metal layer 206 of the RDL 116 forms a trace 1402 over and interconnecting the third plurality of vias 706. The trace 1402 extends out of the tail region 412 into the head region 410. The portion of the trace 1402 disposed the tail region 412 forms a portion of the second lead 428. The portion of the trace 1402 disposed the head region 410 is separated from the ground plane 450 by one of the dielectric layers 218 of the RDL 116. The trace 1402 also forms a first portion of the first coil 420 in the loop region 404. The trace 1402 terminates at or slightly within the cross over region 402.

Also at operation 1908, a portion of the metal layer 206 of the RDL 116 forms the trace 1404 over and interconnecting the second vias 704. The trace 1404 extends out of the tail region 412 into the head region 410. The portion of the trace 1404 disposed the tail region 412 forms a portion of the first lead 426. The portion of the trace 1404 disposed the head region 410 is separated from the ground plane 450 by one of the dielectric layers 218 of the RDL 116. The trace 1404 also forms a second portion of the first coil 420 in the loop region 404. The trace 1404 extends from the first portion of the first coil 420 into the cross over region 402, and forms a first jumper 434 closest to the tail region 412. The first jumper 434 is not directly connected by vias to other metal layers within the region 402. The trace 1404 extends from the first jumper 434 in the cross over region 402 to the first portion of the second coil 422 in the second loop region 404. The trace 1404 extends from the first portion of the second coil 422 into the next cross over region 402, and forms a second jumper 434 defined between the second and third coils 222, 1408. The second jumper 434 is also not directly connected by vias to other metal layers within the region 402. The trace 1404 extends from the second jumper 434 in the second cross over region 402 to the first portion of the third coil 1408 in the third loop region 404. As part of the third coil 1408, the trace 1404 also includes the connection trace 430 and the second portion of the third coil 1408. The trace 1404 terminates at or slightly within the second cross over region 402.

Also at operation 1908, a portion of the metal layer 206 of the RDL 116 forms the trace 1406 disposed in the head region 410 between the second and third coils 222, 1408. The trace 1406 also forms a portion of the second coil 422 in the loop region 404. The trace 1406 begins and terminates at or slightly within the cross over regions 402 on either side of the middle loop region 404.

Figure 15:
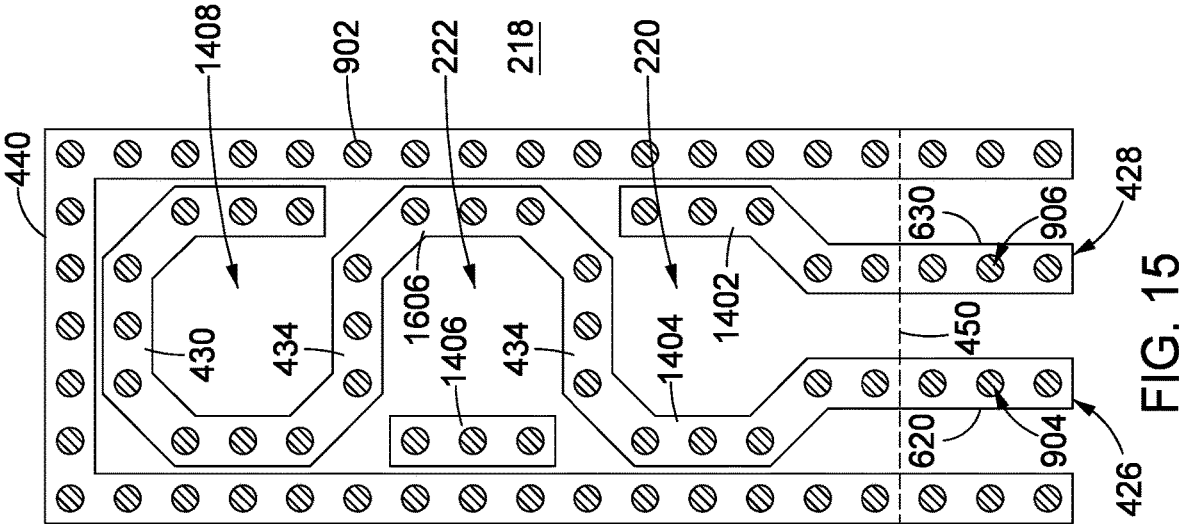

At operation 1910, a first plurality of vias 902, a second plurality of vias 904, and a third plurality of vias 906 are formed, as shown in FIG. 15. The first plurality of vias 902 are formed on the metal traces 802, and are aligned with the first plurality of vias 702. The first plurality of vias 902, the metal traces 802, and the first plurality of vias 702 form a portion of the shield 440 (also as shown in FIG. 4).

The second plurality of vias 904 are formed on the metal trace 1404. Some of vias 904 disposed in the tail region 412 are aligned with the second plurality of vias 704. The metal trace 1404, and the aligned vias 704, 904 form a portion of the first lead 426 of the first inductor 102. The second plurality of vias 904 are also formed on the metal trace 1404 in the loop regions 404 but not the cross over regions 402 of the head region 410.

Similarly, the third plurality of vias 906 are formed on the metal traces 1402, 1406. Some of vias 906 disposed in the tail region 412 are aligned with the third plurality of vias 706. The metal trace 1406, and the aligned vias 706, 906 form a portion of the second lead 428 of the first inductor 102. The third plurality of vias 906 are also formed on the metal trace 1402 in the loop region 404.

None of the vias 902, 904, 906 (or other via) are disposed on the jumpers 434 or in the cross over regions 402 of the head region 410.

After operation 1910 is complete, another dielectric layer 218 is disposed around the vias 902, 904, 906. The vias 902, 904, 906 may be fabricated similar to the vias 702, 704, 706.

Figure 16:
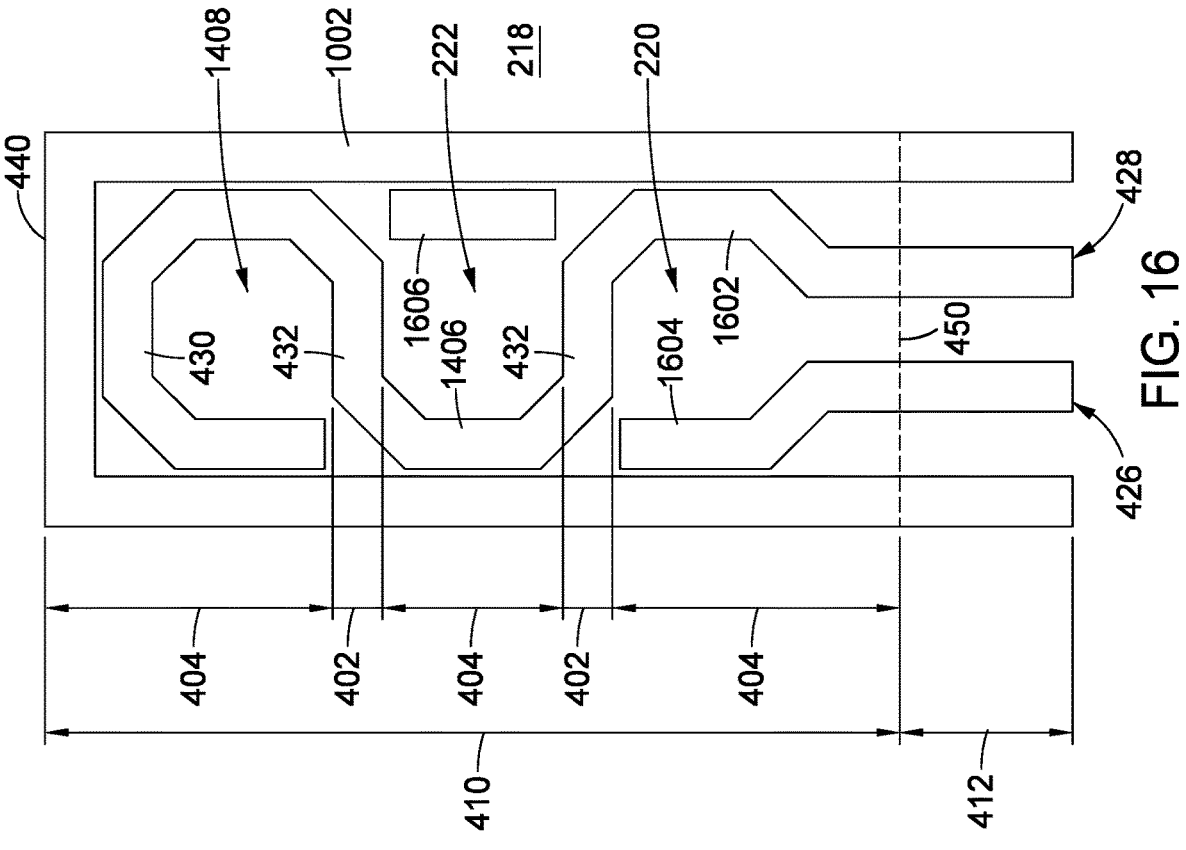

At operation 1912, metal traces 1002, 1602 and 1604 are formed from the metal layer 208 of the RDL 116 that is disposed next to the metal layer 206, as shown in FIG. 16. The metal traces 1002, 1602 and 1604 may be solid, a mesh or has another suitable geometry. The metal traces 1602 and 1604 are separated from the traces 1402, 1404 by one of the dielectric layers 218, except where interconnected by vias 904, 906 and the jumpers 432, 434.

The metal traces 1002 form a portion of the shield 440. The metal traces 1002 may be solid, a mesh or has another suitable geometry.

Also at operation 1912, a portion of the metal layer 208 of the RDL 116 forms the trace 1602 over and interconnecting some of the second plurality of vias 904 and the third plurality of vias 906. The trace 1602 extends out of the tail region 412 into the head region 410. A portion of the trace 1602 residing in the tail region 412 is coupled by the vias 906 to the trace 1402, and forms part of the lead 428.

A portion of the trace 1602 residing in the loop region 404 closest to the tail region 412 also forms the second portion of the first coil 420. The portion of the trace 1602 comprising a portion of the first coil 420 in the loop region 404 is coupled to the trace 1402 by the second plurality of vias 904. The trace 1602 extends from the second portion of the first coil 420 into the cross over region 402 closest to the tail region 412 and forms the first jumper 432. The portion of the trace 1602 disposed in the cross over region 402 is not coupled to any vias such that the first jumper 432 is separated from the first jumper 434 in the same cross over region 402 by one of the dielectric layers 218 of the RDL 116. The trace 1602 extends from the jumper 432 in the first cross over region 402 to the second portion of the second coil 422 in the second loop region 404. The trace 1602 extends from the second portion of the second coil 422 into the second cross over region 402 disposed between adjacent loop regions 404 and forms a second jumper 432. The portion of the trace 1602 disposed in the cross over region 402 is not coupled to any vias such that the second jumper 432 is separated from the first jumper 434 in the same cross over region 402 by one of the dielectric layers 218 of the RDL 116. The trace 1602 extends from the second jumper 432 in the first cross over region 402 to the first portion of the third coil 1408 in the second loop region 404. As part of the third coil 1408, the trace 1602 also includes the connection trace 430 and the first portion of the third coil 1408. The trace 1602 terminates at or slightly within the second cross over region 402. The portion of the trace 1602 disposed in the third coil 1408 in the loop region 404 is coupled to the trace 1404 by the second plurality of vias 904.

Also at operation 1912, another portion of the metal layer 208 of the RDL 116 forms the trace 1604. The trace 1604 extends out of the tail region 412 into the head region 410. A portion of the trace 1604 residing in the tail region 412 is coupled by the vias 904 to the trace 1404, and forms part of the lead 426.

A portion of the trace 1604 residing in the loop region 404 closest to the tail region 412 also forms the portion of the first coil 420. The portion of the trace 1604 comprising a portion of the first coil 420 in the loop region 404 is coupled to the trace 1404 by the second plurality of vias 904. The trace 1604 terminates at or slightly within the cross over region 402 closest to the tail region 412.

Also at operation 1912, another portion of the metal layer 208 of the RDL 116 forms the trace 1606. The trace 1606 is disposed in the head region 410 between the first and second coils 220, 222. The trace 1606 also forms a second portion of the second coil 422 in the loop region 404. The trace 1606 begins and terminates at or slightly within the cross over regions 402 on either side of the middle loop region 404. The trace 1606 is coupled by the vias 906 to the trace 1406.

Thus, after deposition of the traces 1602, 1604, 1606, the first inductor 102 starts at lead 426, through the trace 1604 forming part of the first coil 420, then across the first jumper 434 to the second coil 422. In the region of the first coil 422, the first inductor 102 includes portion of the trace 1604 coupled by vias 904 to the trace 1404. In the region of the second coil 422 coupled to the first jumper 434, the first inductor 102 includes portion of the trace 1606 coupled by vias 904 to the trace 1404. The third coil 1408 is coupled to the second coil 222 by one of the jumpers 434 and one of the jumpers 432. The portions of the traces 1404 and 1602 comprising the third coil 1408 are coupled by vias 904. The third coil 1408 is coupled to the second coil 222 by the jumper 432 farthest from the tail region 412. In the portion of second coil 422 coupled between the two jumpers 432, the trace 1602 is coupled to the trace 1406 by vias 906. The second coil 1408 is coupled to the first coil 220 by the jumper 432 closest to the tail region 412. The portion of the first coil 220 coupled the jumper 432 closest to the tail region 412 comprises portions of traces 1402 and 1602 that are coupled by vias 906, and extends into the tail region 412 to form the lead 428.

After the three or more coils containing first inductor 102 has been formed in the RLD layer 116 at operation 1920, operation 1930 is subsequently performed as described above to form the chip package 100. Once the chip package 100 has been formed, operation 1940 may be performed as described above to form the electronic device 180.

Thus, a chip package and method for fabricating have been described that includes embedded off-die inductors disposed in a substrate and the redistribution layers formed directly below the IC die. Positioning the embedded off-die inductors immediately adjacent the IC die improves communication speeds and reliability, while also freeing space within the IC die space normally occupied by on-die inductors for additional IC devices, improved power routing, and the like. Moreover, the series connected embedded off-die inductors provides increased inductance without utilizing valuable substrate core space. The increased inductance allows for greater power efficiency, and is particularly beneficial in stacked architectures which place high power demands on core vias which further limits the space available for core based inductors While the foregoing is directed to embodiments of the present invention, other and further embodiments of the invention may be devised without departing from the basic scope thereof, and the scope thereof is determined by the claims that follow.

What is claimed is:

1. A chip package comprising:

an integrated circuit (IC) die having functional circuitry;

a substrate having a top side and a bottom side;

a redistribution layer (RDL) disposed between the IC die and the top side of the substrate, the RDL comprising at least a first conductive layer and a second conductive layer that are patterned to form RDL circuitry within the RDL, the RDL circuitry connecting the IC die to the substrate;

a first coil inductor formed from portions of the first conductive layer and the second conductive layer of the RDL; and a second coil inductor disposed in the substrate and coupled in series to the first coil inductor.

2. The chip package of claim 1, wherein the second coil inductor is an air core inductor.

3. The chip package of claim 1, wherein the RDL further comprises:

a shield formed from portions of the first conductive layer and the second conductive layer of the RDL, wherein the shield circumscribes at least three sides of the first coil inductor.

4. The chip package of claim 1, wherein the first coil inductor comprises:

a head region comprising coils; and a tail region comprising first and second leads coupled to the coils, the first lead coupled to the functional circuitry of the IC die and the second lead coupled to the second coil inductor.

5. The chip package of claim 4, wherein the head region of the first coil inductor comprises:

vias connecting portions of the first conductive layer and the second conductive layer forming a first coil of the coils of the head region;

vias connecting portions of the first conductive layer and the second conductive layer forming a second coil of the coils of the head region;

a first jumper formed in the first conductive layer and coupling a portion of the first coil to the second coil; and a second jumper formed in the second conductive layer and coupling another portion of the first coil to the second coil, the second jumper passing over the first jumper.

6. The chip package of claim 5, wherein no vias directly couple the first jumper to the second jumper.

7. The chip package of claim 4, wherein the RDL further comprises:

a ground plane disposed between the first coil inductor and the IC die.

8. The chip package of claim 1, wherein an inductance of the second coil inductor is at least one order of magnitude greater than an inductance of the first coil inductor.

9. The chip package of claim 8, wherein the functional circuitry of the IC die further comprises:

voltage regulator switching circuitry coupled to the first coil inductor.

10. The chip package of claim 1 further comprising:

a third coil inductor formed from portions of the first conductive layer and the second conductive layer of the RDL; and a fourth coil inductor disposed in the substrate and coupled in series to the third coil inductor, the fourth coil inductor disposed adjacent the second coil inductor, the fourth and second coil inductors having coils wound in opposite directions.

11. A chip package comprising:

an integrated circuit (IC) die having functional circuitry;

a package substrate having a top side and a bottom side;

a redistribution layer (RDL) disposed between the IC die and the top side of the package substrate, the RDL comprising at least a first conductive layer and a second conductive layer that are patterned to form RDL circuitry within the RDL, the RDL circuitry connecting the IC die to the package substrate;

a first inductor formed from portions of the first conductive layer and the second conductive layer of the RDL;

a second inductor formed in a core of the package substrate and coupled in series to the first inductor, the second inductor being an air core inductor;

a third inductor formed from portions of the first conductive layer and the second conductive layer of the RDL; and a fourth inductor formed in the core of the package substrate and coupled in series to the third inductor, the fourth inductor being an air core inductor, the fourth inductor disposed adjacent the second inductor, the fourth and second inductors having coils wound in opposite directions.

12. The chip package of claim 11, wherein inductances of the second and fourth inductors each are at least one order of magnitude greater than inductances of the first and third inductors.

13. The chip package of claim 11, wherein a first signal path defined through the first and second series connected inductors is configured to transmit signals having a different voltage domain or different voltage phase than a second signal path defined through the third and fourth series connected inductors.

14. The chip package of claim 13, wherein the functional circuitry of the IC die further comprises:

voltage regulator switching circuitry coupled to the first and second signal paths.

15. The chip package of claim 13, wherein the first inductor comprises:

a head region comprising at least a first coil and a second coil coupled in series, the first and second coils formed from the first and second conductive layers; and a tail region comprising first and second leads coupled to the first and second coils, the first lead coupled to the functional circuitry of the IC die and the second lead coupled to the second inductor.

16. The chip package of claim 15, wherein the head region of the first inductor comprises:

vias connecting portions of the first conductive layer and the second conductive layer forming the first coil;

vias connecting portions of the first conductive layer and the second conductive layer forming the second coil;

a first jumper formed in the first conductive layer and coupling a portion of the first coil to the second coil; and a second jumper formed in the second conductive layer and coupling another portion of the first coil to the second coil, the second jumper passing over the first jumper.

17. The chip package of claim 13, wherein the RDL further comprises:

a ground plane disposed between the first inductor and the IC die.

18. The chip package of claim 11, wherein an inductance of the first inductor is less than 20% of an inductance of the second inductor.

19. A method for fabricating a chip package, the method comprising:

forming a first coil inductor within a redistribution layer (RDL) formed on an integrated circuit (IC) die; and connecting the first coil inductor in series with a second coil inductor formed in or within a substrate to form the chip package.

* * * * *